(12) United States Patent
Arneson et al.

(10) Patent No.: US 7,223,320 B2
(45) Date of Patent: *May 29, 2007

(54) METHOD AND APPARATUS FOR EXPANDING A SEMICONDUCTOR WAFER

(75) Inventors: Michael R. Arneson, Westminister, MD (US); William R. Bandy, Gambrills, MD (US)

(73) Assignee: Symbol Technologies, Inc., Holtsville, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/866,148

(22) Filed: Jun. 14, 2004

(65) Prior Publication Data

US 2004/0250949 A1 Dec. 16, 2004

Related U.S. Application Data

(60) Provisional application No. 60/477,735, filed on Jun. 12, 2003.

(51) Int. Cl.
*B32B 38/10* (2006.01)
(52) U.S. Cl. .................. 156/344; 438/464; 438/976
(58) Field of Classification Search .............. 156/344, 156/584; 438/464, 976
See application file for complete search history.

(56) References Cited

U.S. PATENT DOCUMENTS

| | | | |
|---|---|---|---|
| 3,724,737 A | 4/1973 | Bodnar | |
| 3,891,157 A | 6/1975 | Justus | |
| 3,989,575 A | 11/1976 | Davies et al. | |
| 4,346,514 A | 8/1982 | Makizawa et al. | |
| 4,480,742 A | 11/1984 | Muylle | |
| 4,925,808 A | 5/1990 | Richardson | |
| 5,519,381 A | 5/1996 | Marsh et al. | |
| 5,528,222 A | 6/1996 | Moskowitz et al. | |
| 5,537,105 A | 7/1996 | Marsh et al. | |
| 5,557,280 A | 9/1996 | Marsh et al. | |
| 5,564,888 A | 10/1996 | Doan | |
| 5,566,441 A | 10/1996 | Marsh et al. | |
| 5,585,193 A | 12/1996 | Josephy et al. | |
| 5,618,759 A * | 4/1997 | Boysel | 438/464 |
| 5,725,728 A * | 3/1998 | Fuke et al. | 156/584 |
| 5,837,349 A | 11/1998 | Van Erden et al. | |

(Continued)

FOREIGN PATENT DOCUMENTS

DE 196 34 473 C2 1/1998

(Continued)

OTHER PUBLICATIONS

English Language Abstract for DE 19634473, published Jan. 22, 1998, i page.

(Continued)

*Primary Examiner*—Mark A. Osele
(74) *Attorney, Agent, or Firm*—Sterne, Kessler, Goldstein & Fox PLLC

(57) ABSTRACT

Methods, systems, and apparatuses are described for expanding an area of a semiconductor wafer, an enhancing die transfer capability. A wafer is attached to a support structure. The wafer is separated on the support structure into a plurality of dies. An area of the support structure is increased to increase a space between adjacent dies of the plurality of dies. Dies may be transferred from the expanded support structure.

14 Claims, 21 Drawing Sheets

U.S. PATENT DOCUMENTS

| | | | |
|---|---|---|---|
| 5,904,546 A | 5/1999 | Wood et al. | |
| 5,946,198 A | 8/1999 | Hoppe et al. | |
| 5,982,284 A | 11/1999 | Baldwin et al. | |
| 6,018,299 A | 1/2000 | Eberhardt | |
| 6,082,660 A | 7/2000 | Meyer | |
| 6,091,332 A | 7/2000 | Eberhardt et al. | |
| 6,145,901 A | 11/2000 | Rich | |
| 6,147,662 A | 11/2000 | Grabau et al. | |
| 6,165,386 A | 12/2000 | Endo et al. | |
| 6,189,591 B1 * | 2/2001 | Ariye et al. | 156/584 |
| 6,206,292 B1 | 3/2001 | Robertz et al. | |
| 6,215,194 B1 | 4/2001 | Nakabayashi | |
| 6,262,692 B1 | 7/2001 | Babb | |
| 6,265,977 B1 | 7/2001 | Vega et al. | |
| 6,281,795 B1 | 8/2001 | Smith et al. | |
| 6,303,462 B1 * | 10/2001 | Gidon | 438/406 |
| 6,322,903 B1 | 11/2001 | Siniaguine et al. | |
| 6,416,608 B1 | 7/2002 | Mynott et al. | |
| 6,451,154 B1 | 9/2002 | Grabau et al. | |
| 6,514,790 B1 | 2/2003 | Plettner et al. | |
| 6,534,386 B2 * | 3/2003 | Irie | 438/464 |
| 6,606,247 B2 | 8/2003 | Credelle et al. | |
| 6,608,370 B1 | 8/2003 | Chen et al. | |
| 6,731,353 B1 | 5/2004 | Credelle et al. | |
| 6,879,029 B2 * | 4/2005 | Ueda et al. | 257/678 |
| 2001/0016400 A1 * | 8/2001 | Lee | 438/458 |
| 2003/0136503 A1 | 7/2003 | Green et al. | |
| 2004/0020037 A1 | 2/2004 | Arneson et al. | |
| 2004/0020040 A1 | 2/2004 | Arneson et al. | |

FOREIGN PATENT DOCUMENTS

| | | |
|---|---|---|
| DE | 198 05 031 C2 | 8/1999 |
| DE | 198 40 226 A1 | 3/2000 |
| FR | 2 775 533 | 9/1999 |
| WO | WO 00/14733 A1 | 3/2000 |
| WO | WO 01/54058 A1 | 7/2001 |
| WO | WOX 01/61646 A1 | 8/2001 |
| WO | WO 01/95241 A1 | 12/2001 |
| WO | WO 02/37414 A1 | 5/2002 |
| WO | WO 02/49093 A1 | 6/2002 |
| WO | WO 02/082368 A1 | 10/2002 |

OTHER PUBLICATIONS

English Langauage Abstract for DE 19805031, published Aug. 19, 1999, 1 page.

English Language Abstract for DE 19840226, published Mar. 16, 2000, 1 page.

English Language Abstract for FR 2775533, published Sep. 3, 1999. 1 page.

Sarma, Sanjay, "White Paper-Towards the 5¢ Tag", Auto-ID Center, Published Nov. 1, 2001, pp. 1-19.

* cited by examiner

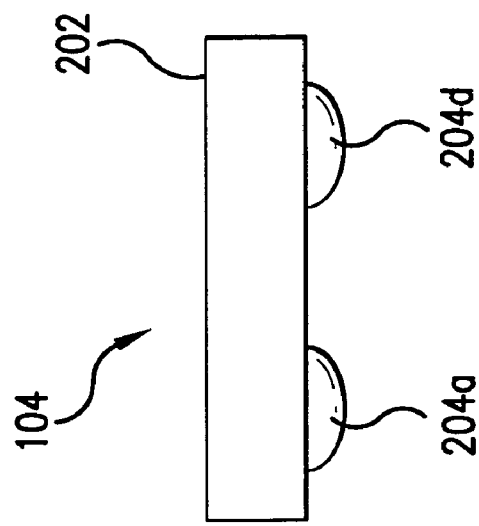
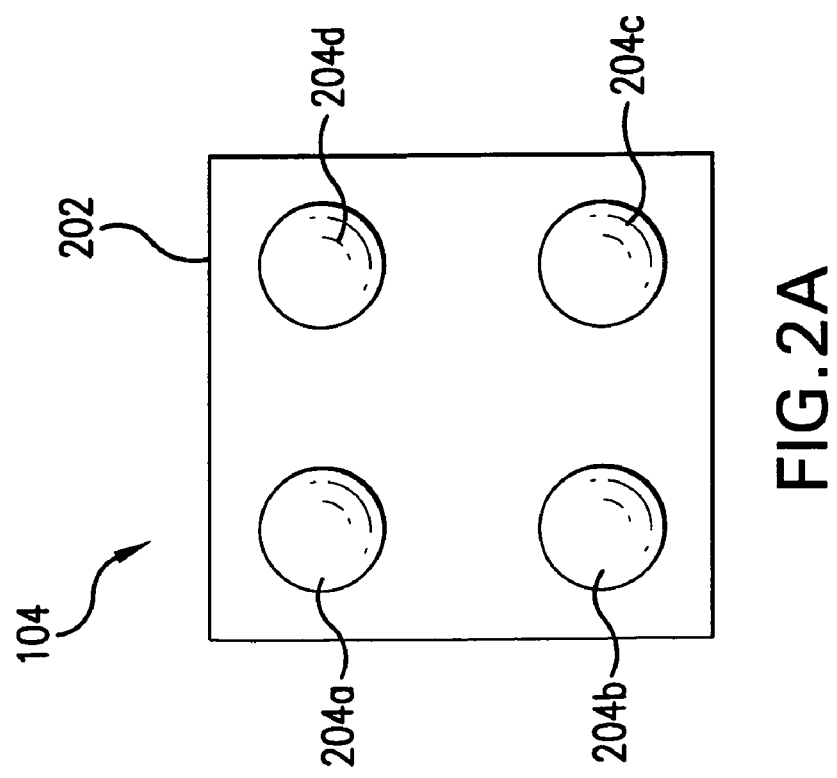

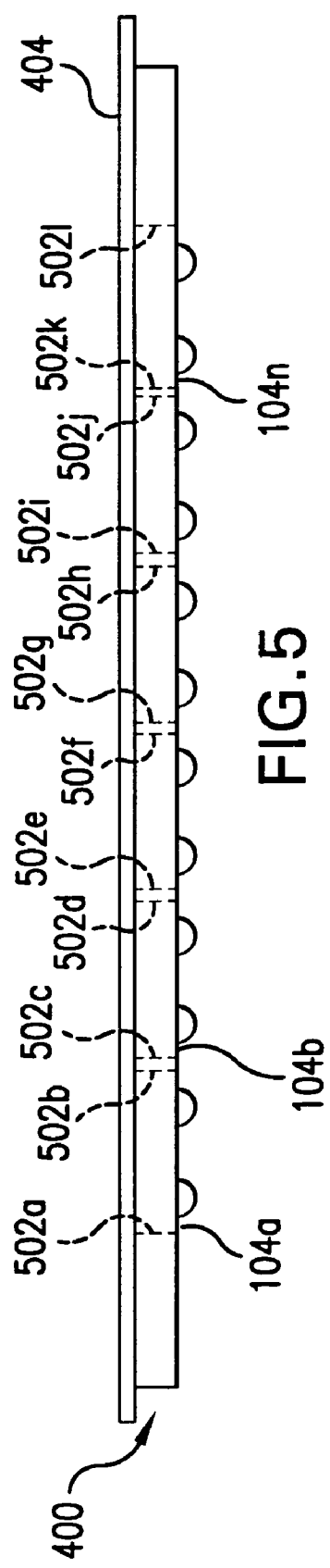

METHOD AND APPARATUS FOR EXPANDING A SEMICONDUCTOR WAFER

CROSS-REFERENCE TO RELATED APPLICATIONS

This application claims the benefit of U.S. Provisional Application No. 60/477,735, filed Jun. 12, 2003, which is herein incorporated by reference in its entirety.

The following applications of common assignee are related to the present application, have the same filing date as the present application, and are herein incorporated by reference in their entireties:

"Method, System, And Apparatus For Authenticating Devices During Assembly," U.S. Ser. No. 10/866,152;

"Method, System, And Apparatus For Transfer Of Dies Using A Die Plate Having Die Cavities," U.S. Ser. No. 10/866,150;

"Method, System, And Apparatus For Transfer Of Dies Using A Die Plate," U.S. Ser. No. 10/866,253;

"Method, System, And Apparatus For Transfer Of Dies Using A Pin Plate," U.S. Ser. No. 10/866,159;

"Method, System, And Apparatus For High Volume Transfer Of Dies," U.S. Ser. No. 10/866,149; and "Method, System, And Apparatus For High Volume Assembly Of Compact Discs And Digital Video Discs Incorporating Radio Frequency Identification Tag Technology," U.S. Ser. No. 10/866,151.

The following applications of common assignee are related to the present application, and are herein incorporated by reference in their entireties "Method and Apparatus for High Volume Assembly of Radio Frequency Identification Tags," U.S. Provisional App. No. 60/400,101, filed Aug. 2, 2002;

"Method and Apparatus for High Volume Assembly of Radio Frequency Identification Tags," Ser. No. 10/322,467, filed Dec. 19, 2002;

"Multi-Barrel Die Transfer Apparatus and Method for Transferring Dies Therewith," Ser. No. 10/322,718, filed Dec. 19, 2002;

"Die Frame Apparatus and Method of Transferring Dies Therewith," Ser. No. 10/322,701, filed Dec. 19, 2002;

"System and Method of Transferring Dies Using an Adhesive Surface," Ser. No. 10/322,702, filed Dec. 19, 2002; and "Method and System for Forming a Die Frame and for Transferring Dies Therewith," Ser. No. 10/429,803, filed May 6, 2003.

BACKGROUND OF THE INVENTION

1. Field of the Invention

The present invention relates generally to the assembly of electronic devices. More particularly, the present invention relates to the transfer of dies from wafers to substrates, including substrates of radio frequency identification (RFID) tags.

2. Related Art

Pick and place techniques are often used to assemble electronic devices. Such techniques involve a manipulator, such as a robot arm, to remove integrated circuit (IC) dies from a wafer and place them into a die carrier. The dies are subsequently mounted onto a substrate with other electronic components, such as antennas, capacitors, resistors, and inductors to form an electronic device.

Pick and place techniques involve complex robotic components and control systems that handle only one die at a time. This has a drawback of limiting throughput volume. Furthermore, pick and place techniques have limited placement accuracy, and have a minimum die size requirement.

One type of electronic device that may be assembled using pick and place techniques is an RFID "tag." An RFID tag may be affixed to an item whose presence is to be detected and/or monitored. The presence of an RFID tag, and therefore the presence of the item to which the tag is affixed, may be checked and monitored by devices known as "readers."

As market demand increases for products such as RFID tags, and as die sizes shrink, high assembly throughput rates for very small die, and low production costs are crucial in providing commercially-viable products. Accordingly, what is needed is a method and apparatus for high volume assembly of electronic devices, such as RFID tags, that overcomes these limitations.

SUMMARY OF THE INVENTION

The present invention is directed to methods, systems, and apparatuses for producing one or more electronic devices, such as RFID tags, that each include a die having one or more electrically conductive contact pads that provide electrical connections to related electronics on a substrate.

According to the present invention, electronic devices are formed at much greater rates than conventionally possible. In one aspect, large quantities of dies can be transferred directly from a wafer to corresponding substrates of a web of substrates. In another aspect, large quantities of dies can be transferred from a support surface to corresponding substrates of a web of substrates. In another aspect, large quantities of dies can be transferred from a wafer or support surface to an intermediate surface, such as a die plate. The die plate may have cells formed in a surface thereof in which the dies reside. Otherwise, the dies can reside on a surface of the die plate. The dies of the die plate can then be transferred to corresponding substrates of a web of substrates.

In an aspect, a punch plate, punch roller or cylinder, or expandable material can be used to transfer dies from the die plate to substrates.

Large quantities of dies can be transferred. For example, 10s, 100s, 1000s, or more dies, or even all dies of a wafer, support surface, or die plate, can be simultaneously transferred to corresponding substrates of a web.

In an aspect of the present invention, an area of a semiconductor wafer is expanded, an enhancing die transfer capability. A wafer is attached to a support structure. The wafer is separated on the support structure into a plurality of dies. An area of the support structure is increased to increase a space between adjacent dies of the plurality of dies. Dies may be transferred from the expanded support structure.

In one aspect, dies may be transferred between surfaces in a "pads up" orientation. When dies are transferred to a substrate in a "pads up" orientation, related electronics can be printed or otherwise formed to couple contact pads of the die to related electronics of the tag substrate.

In an alternative aspect, the dies may be transferred between surfaces in a "pads down" orientation. When dies are transferred to a substrate in a "pads down" orientation, related electronics can be pre-printed or otherwise pre-deposited on the tag substrates.

These and other advantages and features will become readily apparent in view of the following detailed description of the invention.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIGS. 2A and 2B show plan and side views of an exemplary die, respectively.

FIG. 5 is a view of a wafer having separated dies affixed to a support surface.

Figure 1A:
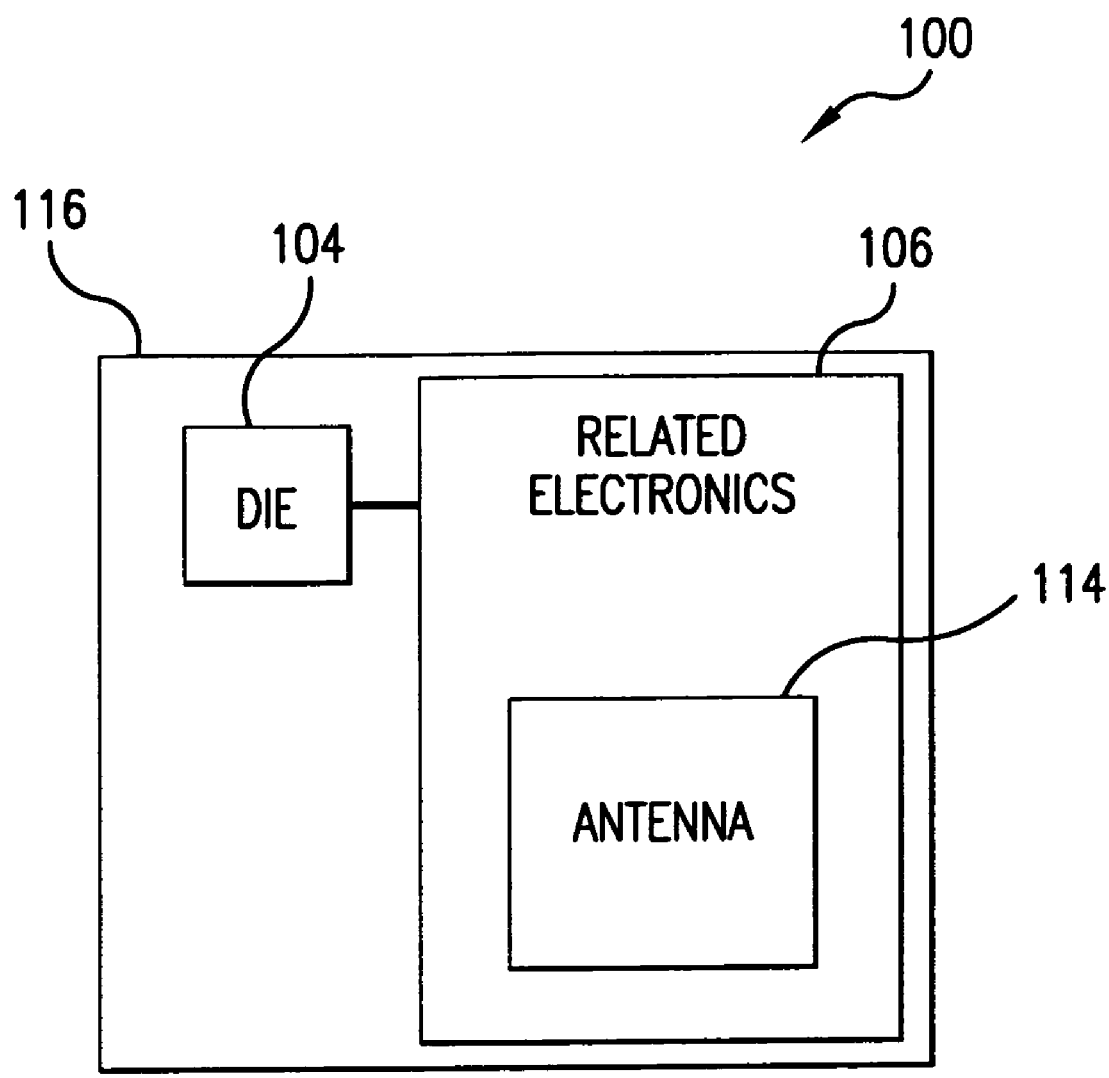
FIG. 1A shows a block diagram of an exemplary RFID tag, according to an embodiment of the present invention.

The present invention will now be described with reference to the accompanying drawings. In the drawings, like reference numbers generally indicate identical, functionally similar, and/or structurally similar elements. The drawing in which an element first appears is indicated by the leftmost digit(s) in the reference number.

DETAILED DESCRIPTION OF THE INVENTION

The present invention provides improved processes and systems for assembling electronic devices, including RFID tags. The present invention provides improvements over current processes. Conventional techniques include vision-based systems that pick and place dies one at a time onto substrates. The present invention can transfer multiple dies simultaneously. Vision-based systems are limited as far as the size of dies that may be handled, such as being limited to dies larger than 600 microns square. The present invention is applicable to dies 100 microns square and even smaller. Furthermore, yield is poor in conventional systems, where two or more dies may be accidentally picked up at a time, causing losses of additional dies. The present invention allows for improved yield values.

The present invention provides an advantage of simplicity. Conventional die transfer tape mechanisms may be used by the present invention. Furthermore, much higher fabrication rates are possible. Current techniques process 5-8 thousand units per hour. The present invention can provide improvements in these rates by a factor of N. For example, embodiments of the present invention can process dies 5 times as fast as conventional techniques, at 100 times as fast as conventional techniques, and at even faster rates. Furthermore, because the present invention allows for flip-chip die attachment techniques, wire bonds are not necessary.

Elements of the embodiments described herein may be combined in any manner. Example RFID tags are described in the section below. Assembly embodiments for RFID tags are described in the next section. Example applications for tags and tag assembly techniques are then described, followed by a description of example substrate webs and antenna layouts.

1.0 RFID Tag

The present invention is directed to techniques for producing electronic devices, such as RFID tags. For illustrative purposes, the description herein primarily relates to the production of RFID tags. However, the description is also adaptable to the production of further electronic device types, as would be understood by persons skilled in the relevant art(s) from the teachings herein.

Figure 1B:
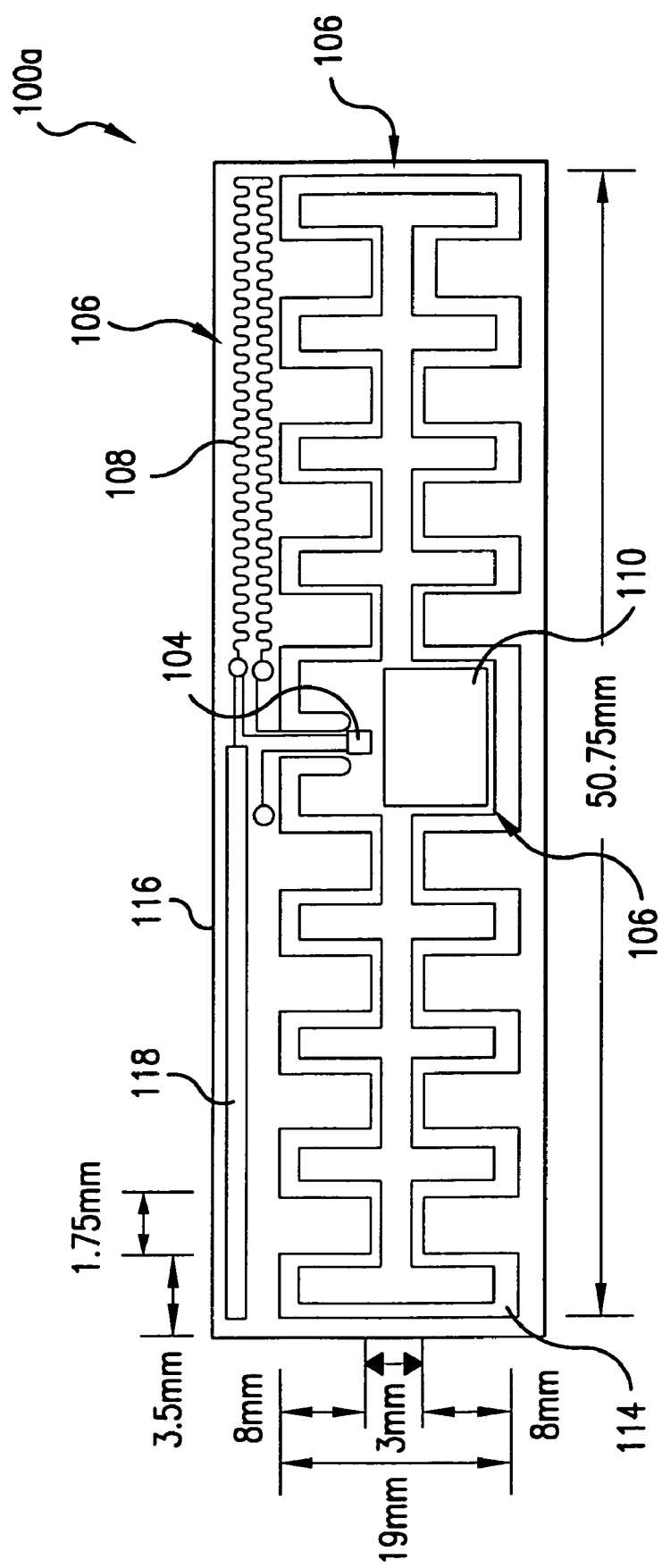
FIGS. 1B and 1C show detailed views of exemplary RFID tags, according to embodiments of the present invention.
Figure 1C:
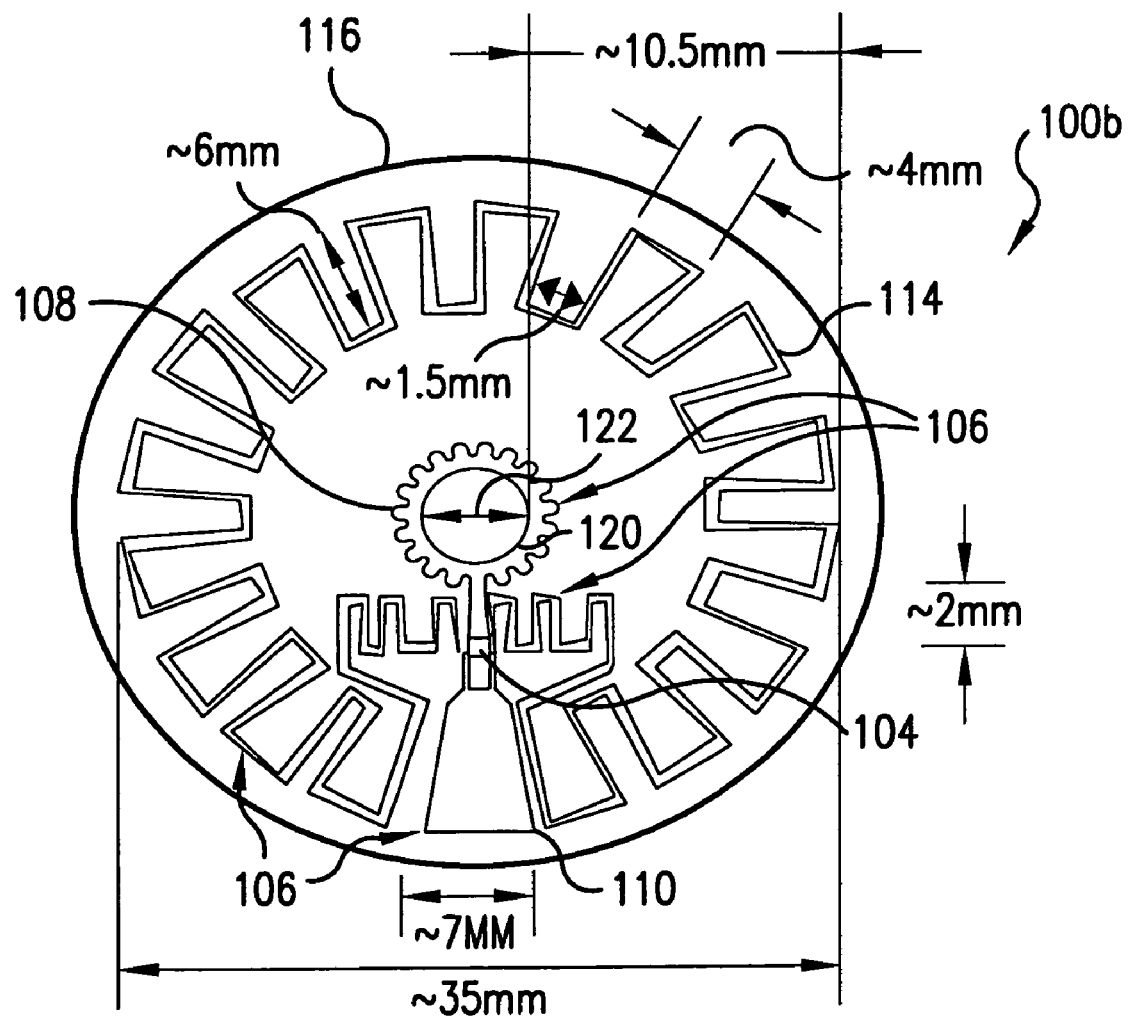

FIG. 1A shows a block diagram of an exemplary RFID tag 100, according to an embodiment of the present invention. As shown in FIG. 1A, RFID tag 100 includes a die 104 and related electronics 106 located on a tag substrate 116. Related electronics 106 includes an antenna 114 in the present example. FIGS. 1B and 1C show detailed views of exemplary RFID tags 100, indicated as RFID tags 100a and 100b. As shown in FIGS. 1B and 1C, die 104 can be mounted onto antenna 114 of related electronics 106. As is further described elsewhere herein, die 104 may be mounted in either a pads up or pads down orientation.

RFID tag 100 may be located in an area having a large number, population, or pool of RFID tags present. RFID tag 100 receives interrogation signals transmitted by one or more tag readers. According to interrogation protocols, RFID tag 100 responds to these signals. Each response includes information that identifies the corresponding RFID tag 100 of the potential pool of RFID tags present. Upon reception of a response, the tag reader determines the identity of the responding tag, thereby ascertaining the existence of the tag within a coverage area defined by the tag reader.

RFID tag 100 may be used in various applications, such as inventory control, airport baggage monitoring, as well as security and surveillance applications. Thus, RFID tag 100 can be affixed to items such as airline baggage, retail inventory, warehouse inventory, automobiles, compact discs (CDs), digital video discs (DVDs), video tapes, and other objects. RFID tag 100 enables location monitoring and real time tracking of such items.

In the present embodiment, die 104 is an integrated circuit that performs RFID operations, such as communicating with one or more tag readers (not shown) according to various interrogation protocols. Exemplary interrogation protocols are described in U.S. Pat. No. 6,002,344 issued Dec. 14, 1999 to Bandy et al. entitled System and Method for Electronic Inventory, and U.S. patent application Ser. No. 10/072,885, filed on Feb. 12, 2002, both of which are incorporated by reference herein in its entirety. Die 104 includes a plurality of contact pads that each provide an electrical connection with related electronics 106.

Related electronics 106 are connected to die 104 through a plurality of contact pads of IC die 104. In embodiments, related electronics 106 provide one or more capabilities, including RF reception and transmission capabilities, sensor functionality, power reception and storage functionality, as well as additional capabilities. The components of related electronics 106 can be printed onto a tag substrate 116 with materials, such as conductive inks. Examples of conductive inks include silver conductors 5000, 5021, and 5025, produced by DuPont Electronic Materials of Research Triangle Park, N.C. Other materials or means suitable for printing related electronics 106 onto tag substrate 116 include polymeric dielectric composition 5018 and carbon-based PTC resistor paste 7282, which are also produced by DuPont Electronic Materials of Research Triangle Park, N.C. Other materials or means that may be used to deposit the component material onto the substrate would be apparent to persons skilled in the relevant art(s) from the teachings herein.

As shown in FIGS. 1A-1C, tag substrate 116 has a first surface that accommodates die 104, related electronics 106, as well as further components of tag 100. Tag substrate 116 also has a second surface that is opposite the first surface. An adhesive material or backing can be included on the second surface. When present, the adhesive backing enables tag 100 to be attached to objects, such as books and consumer products. Tag substrate 116 is made from a material, such as polyester, paper, plastic, fabrics such as cloth, and/or other materials such as commercially available Tyvec®.

In some implementations of tags 100, tag substrate 116 can include an indentation, "cavity," or "cell" (not shown in FIGS. 1A-1C) that accommodates die 104. An example of such an implementation is included in a "pads up" orientation of die 104.

FIGS. 2A and 2B show plan and side views of an example die 104. Die 104 includes four contact pads 204a-d that provide electrical connections between related electronics 106 and internal circuitry of die 104. Note that although four contact pads 204a-d are shown, any number of contact pads may be used, depending on a particular application. Contact pads 204 are made of an electrically conductive material during fabrication of the die. Contact pads 204 can be further built up if required by the assembly process, by the deposition of additional and/or other materials, such as gold and solder flux. Such post processing, or "bumping," will be known to persons skilled in the relevant art(s).

Figure 2C:
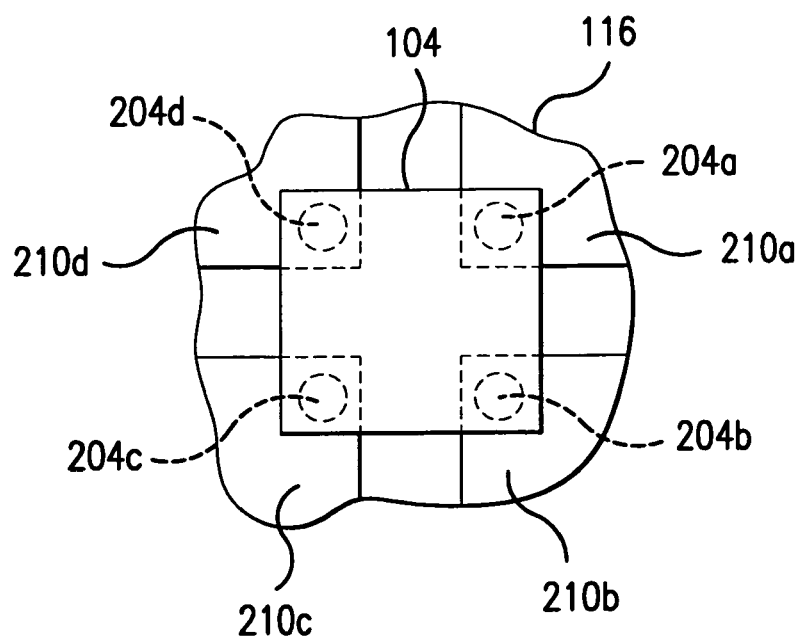
FIGS. 2C and 2D show portions of a substrate with a die attached thereto, according to example embodiments of the present invention.
Figure 2D:
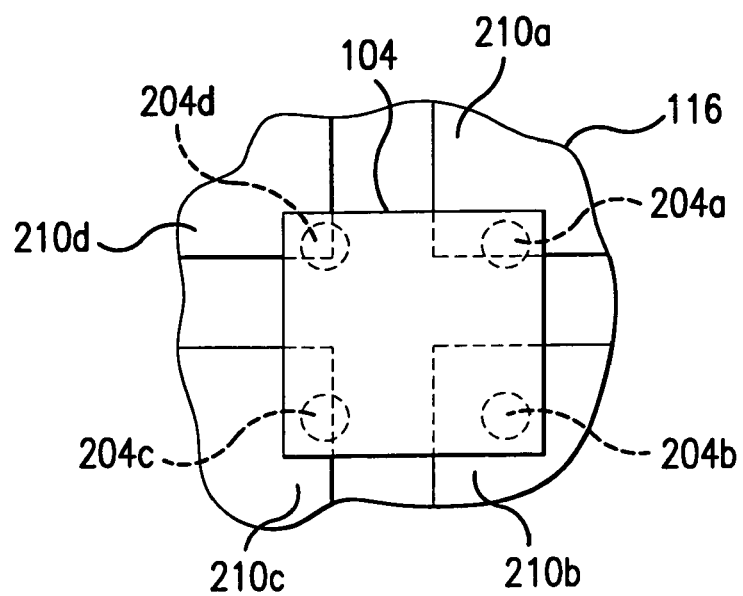

FIG. 2C shows a portion of a substrate 116 with die 104 attached thereto, according to an example embodiment of the present invention. As shown in FIG. 2C, contact pads 204a-d of die 104 are coupled to respective contact areas 210a-d of substrate 116. Contact areas 210a-d provide electrical connections to related electronics 106. The arrangement of contact pads 204a-d in a rectangular (e.g., square) shape allows for flexibility in attachment of die 104 to substrate 116, and good mechanical adherement. This arrangement allows for a range of tolerance for imperfect placement of IC die 104 on substrate 116, while still achieving acceptable electrical coupling between contact pads 204a-d and contact areas 210a-d. For example, FIG. 2D shows an imperfect placement of IC die 104 on substrate 116. However, even though IC die 104 has been improperly placed, acceptable electrical coupling is achieved between contact pads 204a-d and contact areas 210a-d.

Note that although FIGS. 2A-2D show the layout of four contact pads 204a-d collectively forming a rectangular shape, greater or lesser numbers of contact pads 204 may be used. Furthermore, contact pads 204a-d may be laid out in other shapes in embodiments of the present invention.

2.0 RFID Tag Assembly

The present invention is directed to continuous-roll assembly techniques and other techniques for assembling tags, such as RFID tag 100. Such techniques involve a continuous web (or roll) of the material of the tag antenna substrate 116 that is capable of being separated into a plurality of tags. Alternatively, separate sheets of the material can be used as discrete substrate webs that can be separated into a plurality of tags. As described herein, the manufactured one or more tags can then be post processed for individual use. For illustrative purposes, the techniques described herein are made with reference to assembly of RFID tag 100. However, these techniques can be applied to other tag implementations and other suitable devices, as would be apparent to persons skilled in the relevant art(s) from the teachings herein.

The present invention advantageously eliminates the restriction of assembling electronic devices, such as RFID tags, one at a time, allowing multiple electronic devices to be assembled in parallel. The present invention provides a continuous-roll technique that is scalable and provides much higher throughput assembly rates than conventional pick and place techniques.

Figure 3:
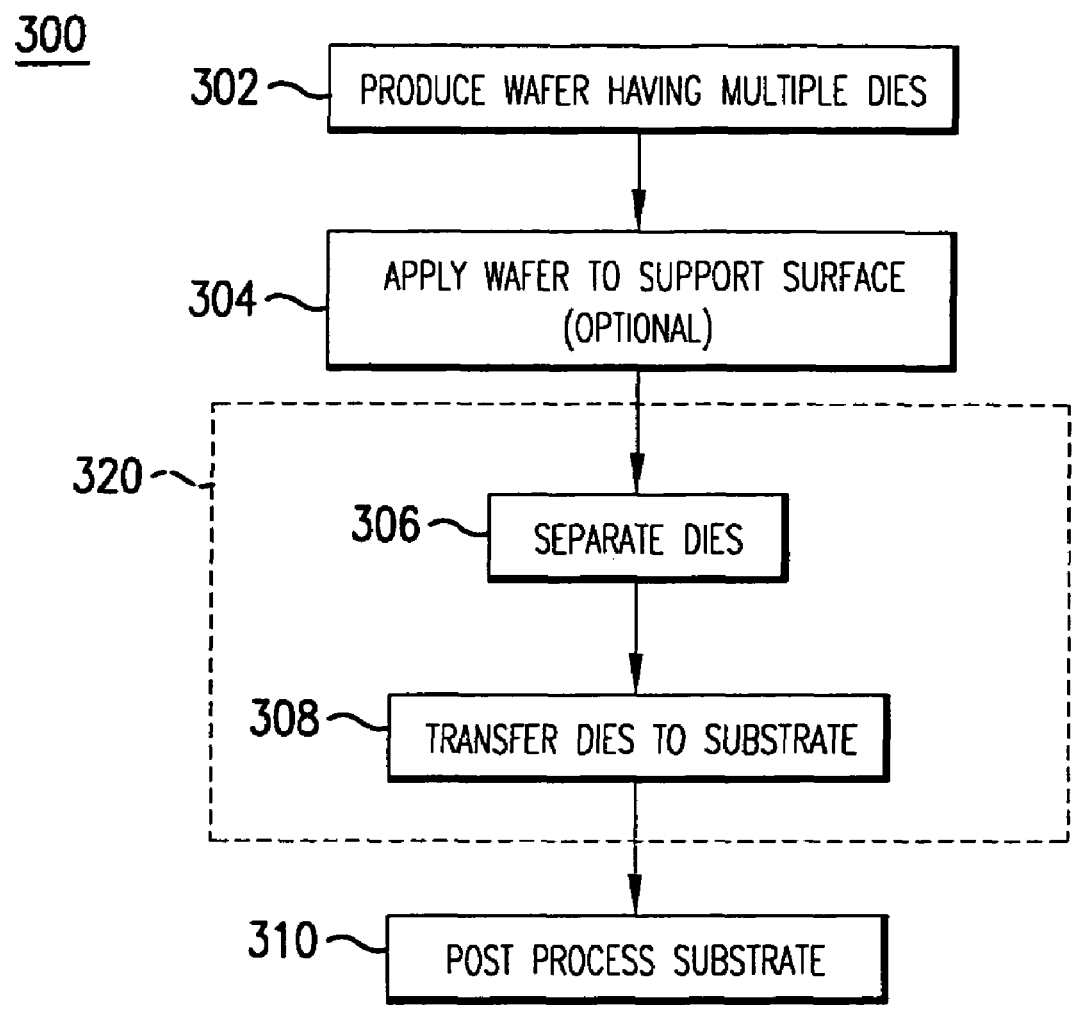
FIG. 3 is a flowchart illustrating a tag assembly process, according to embodiments of the present invention.

FIG. 3 shows a flowchart 300 with example steps relating to continuous-roll production of RFID tags 100, according to example embodiments of the present invention. FIG. 3 shows a flowchart illustrating a process 300 for assembling tags 100. Process 300 begins with a step 302. In step 300, a wafer 400 having a plurality of dies 104 is produced. FIG.

Figure 4A:
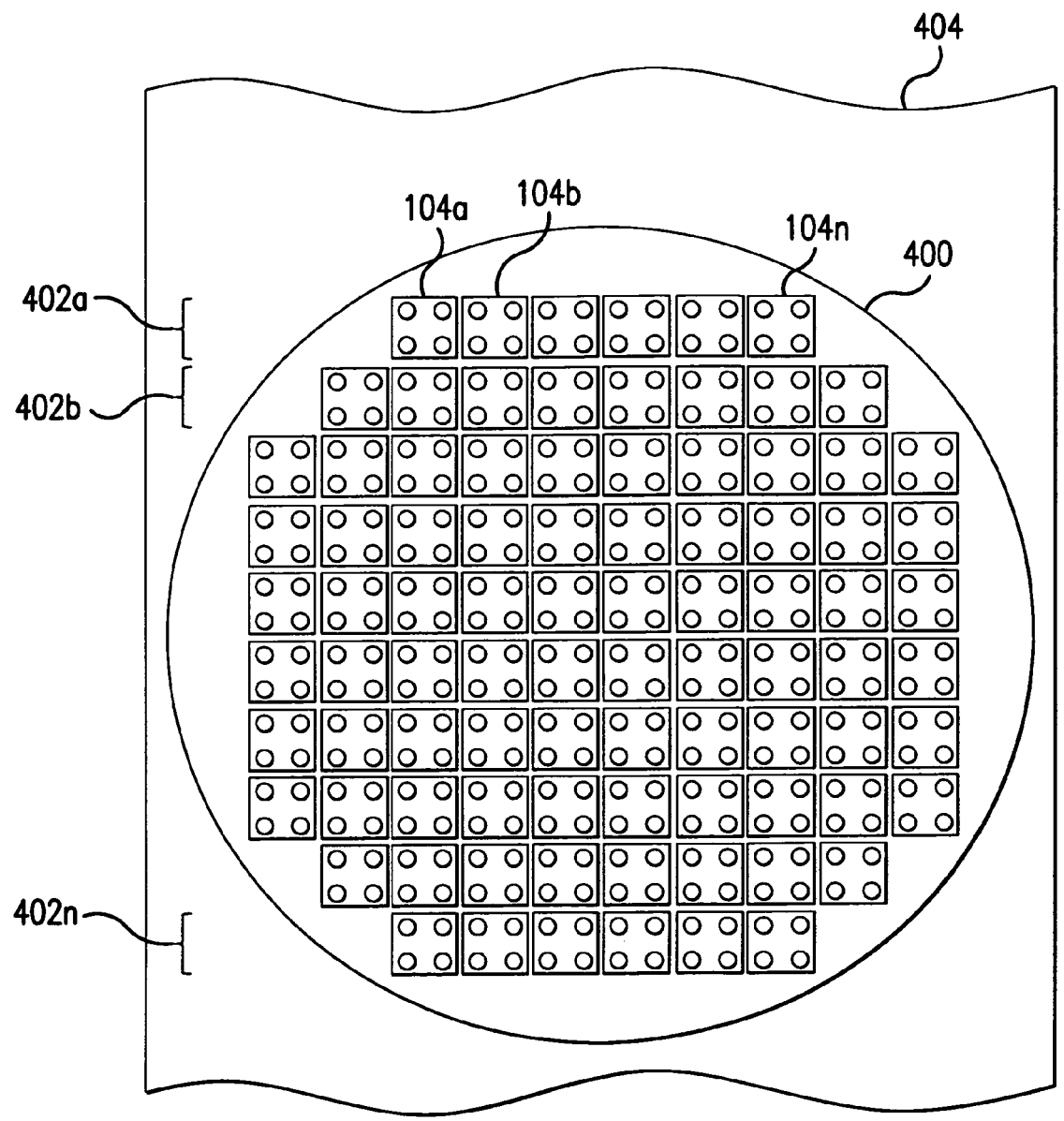
FIGS. 4A and 4B are plan and side views of a wafer having multiple dies affixed to a support surface, respectively.

4A illustrates a plan view of an exemplary wafer 400. As illustrated in FIG. 4A, a plurality of dies 104 are arranged in a plurality of rows 402a-n.

Figure 4B:
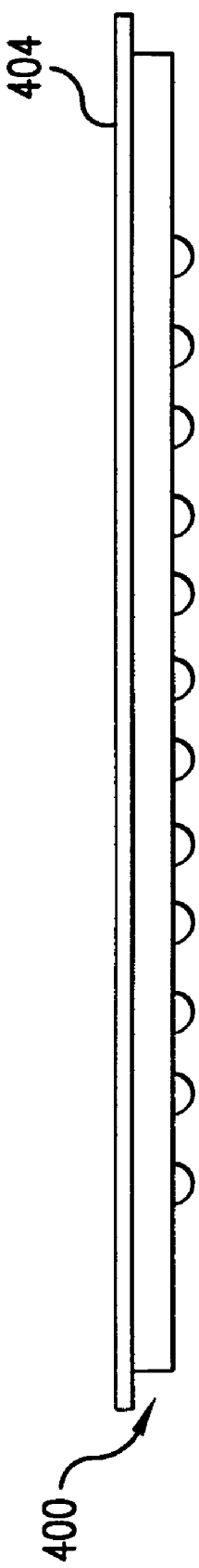

In a step 304, wafer 400 is optionally applied to a support structure or surface 404. Support surface 404 includes an adhesive material to provide adhesiveness. For example support surface 404 may be an adhesive tape that holds wafer 400 in place for subsequent processing. FIG. 4B shows an example view of wafer 400 in contact with an example support surface 404. In some embodiments, wafer 400 does not need to be attached to a support surface, and can be operated on directly.

In a step 306, the plurality of dies 104 on wafer 400 are separated. For example, step 306 may include scribing wafer 400 according to a process, such as sawing or laser etching, or other wafer separating or scribing process. FIG. 5 shows a view of wafer 400 having example separated dies 104 that are in contact with support surface 404. FIG. 5 shows a plurality of scribe lines 502a-l that indicate locations where dies 104 are separated.

In a step 308, the plurality of dies 104 is transferred to a substrate. For example, dies 104 can be transferred from support surface 404 to tag substrates 116. Alternatively, dies 104 can be directly transferred from wafer 400 to substrates 116. In an embodiment, step 308 may allow for "pads down" transfer. Alternatively, step 308 may allow for "pads up" transfer. As used herein the terms "pads up" and "pads down" denote alternative implementations of tags 100. In particular, these terms designate the orientation of connection pads 204 in relation to tag substrate 116. In a "pads up" orientation for tag 100, die 104 is transferred to tag substrate 116 with pads 204a-204d facing away from tag substrate 116. In a "pads down" orientation for tag 100, die 104 is transferred to tag substrate 116 with pads 204a-204d facing towards, and in contact with tag substrate 116.

Note that step 308 may include multiple die transfer iterations. For example, in step 308, dies 104 may be directly transferred from a wafer 400 to substrates 116. Alternatively, dies 104 may be transferred to an intermediate structure, and subsequently transferred to substrates 116. Example embodiments of such die transfer options are described below.

Note that steps 306 and 308 can be performed simultaneously in some embodiments. This is indicated in FIG. 3 by step 320, which includes both of steps 306 and 308. Example embodiments where dies 104 of a wafer 400 are separated, and simultaneously transferred to a subsequent surface, are described below.

In a step 310, post processing is performed. During step 310, assembly of RFID tag(s) 100 is completed.

Figure 6:
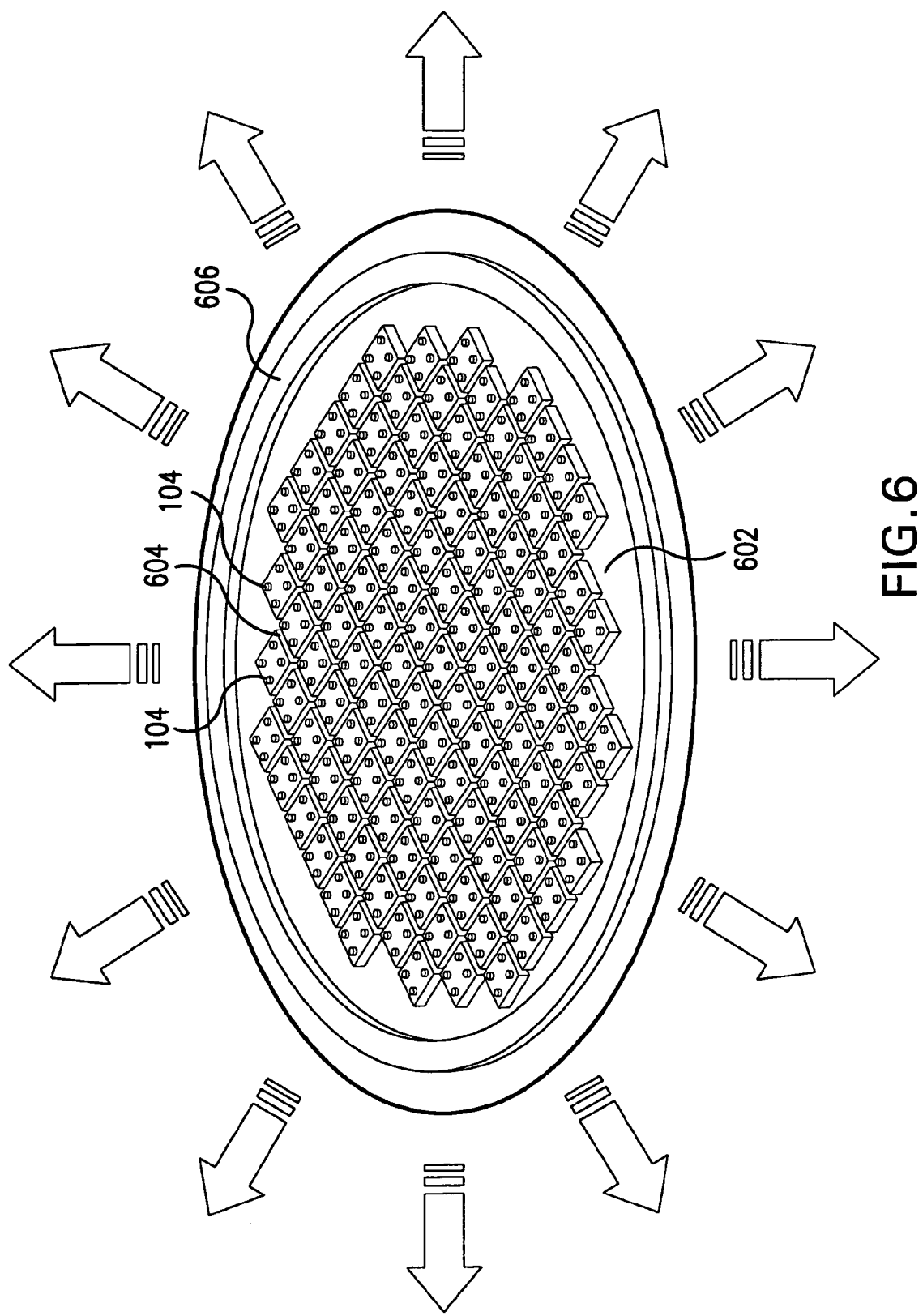
FIG. 6 shows a wafer that has been separated on a support surface being expanded in all directions, according to an embodiment of the present invention.

In an embodiment, flowchart 300, shown in FIG. 3, can include an additional step after step 306, where the wafer is expanded. For example, in FIG. 6, a wafer that has been separated on a support surface or structure 602 is shown being expanded in all directions. In embodiments, support surface 602 attaching the separated dies 104 can be stretched in any number of one or more axes in the plane of the wafer. For example, support surface 602 can be expanded in both orthogonal X and Y axes. Support surface 602 can be expanded by the same amount, or different amounts, in the X and Y axes. By expanding the wafer, an area of the support surface 602 is increased. By increasing an area of the support surface 602, a space or gap 604 between adjacent dies 104 can be increased. By increasing space or gap 604 between adjacent dies 104, dies 104 may be more easily transferred from the support surface 602 to another surface, as is described further below.

Figures 7A, 7B, 7C:
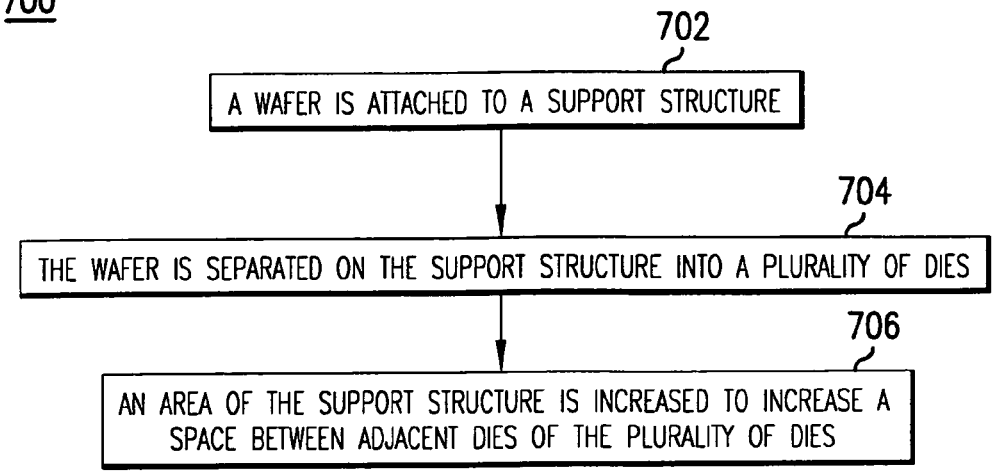
FIGS. 7A-7C show example steps related to a process for expanding a wafer, according to embodiments of the present invention.

FIGS. 7A-7C show example steps related to a flowchart 700 for expanding a wafer, and transferring dies therewith, according to embodiments of the present invention. The steps shown in FIGS. 7A-7C are described in detail below. Further operational and structural embodiments of the present invention will be apparent to persons skilled in the relevant arts based on the following discussion.

Flowchart 700 shown in FIG. 7A begins with step 702. In step 702, a wafer is attached to a support structure. This step is similar to step 304 shown in FIG. 3.

In step 704, the wafer is separated on the support structure into a plurality of dies. For example, step 704 is similar to step 306 shown in FIG. 3.

In step 706, an area of the support structure is increased to increase a space between adjacent dies of the plurality of dies. For example, the area of the support structure can be increased along one or more axes to increase an area of the support structure. For example, the support structure may be stretched along orthogonal X and Y axes.

FIG. 7B shows an additional step for flowchart 700, according to an example embodiment of the present invention. In step 708, the plurality of dies are transferred from the support structure. For example, in embodiments, the plurality of dies can be transferred to an intermediate surface, or can even be transferred to a final destination surface, such as a surface of a substrate. Because an area of the support surface has been enlarged, die transfer to an intermediate or final surface can be more easily accomplished, as there is a greater spacing between dies (i.e., "die pitch"), which can make the transfer of the dies more easily accomplished. For example, if the plurality of dies are being transferred to substrates, the substrates can be larger or further spread apart because the gap or space between dies has been increased on the support structure. This allows for more space for the structures performing the die transfer, for example.

FIG. 7C shows additional steps for flowchart 700 of FIG. 7A, according to another embodiment of the present invention. The steps of FIG. 7C create a solid grid, or die frame, between the dies on the enlarged support structure to hold the dies so that the dies may be later transferred to another surface. Thus, the steps of FIG. 7C may be used to create a solid grid/die frame that removably holds dies. Such a die frame is further described in related Ser. No. 10/322,701, entitled "Die Frame Apparatus and Method of Transferring Dies Therewith," referenced above.

The steps shown in FIG. 7C begin with the step 710. In step 710, a solidifiable material is inserted into the increased space between adjacent dies.

In step 712, the solidifiable material is caused to harden into a solid grid that removably holds the plurality of dies.

In step 714, the support structure is removed from the solid grid that removably holds the plurality of dies. Thus, the dies remain removably held by the solid grid.

In step 716, at least one die of the plurality of dies is transferred from the solid grid to a surface. Thus, the solid grid can be used to transfer the dies that are removably held.

2.1 Die Transfer Embodiments

Step 308 shown in FIG. 3, and discussed above, relates to transferring dies to a tag substrate. The dies can be attached to a support surface (e.g., as shown in FIG. 5), or can be transferred directly from the wafer, and can be transferred to the tag substrate by a variety of techniques. Conventionally, the transfer is accomplished using a pick and place tool. The pick and place tool uses a vacuum die collet controlled by a robotic mechanism that picks up the die from the support structure by a suction action, and holds the die securely in the die collet. The pick and place tool deposits the die into a die carrier or transfer surface. For example, a suitable transfer surface is a "punch tape" manufactured by Mulbauer, Germany. A disadvantage of the present pick and place approach is that only one die at a time may be transferred. Hence, the present pick and place approach does not scale well for very high throughput rates.

The present invention allows for the transfer of more than one die at a time from a support surface to a transfer surface. In fact, the present invention allows for the transfer of more than one die between any two surfaces, including transferring dies from a wafer or support surface to an intermediate surface, transferring dies between multiple intermediate surfaces, transferring dies between an intermediate surface and the final substrate surface, and transferring dies directly from a wafer or support surface to the final substrate surface.

Figure 8:
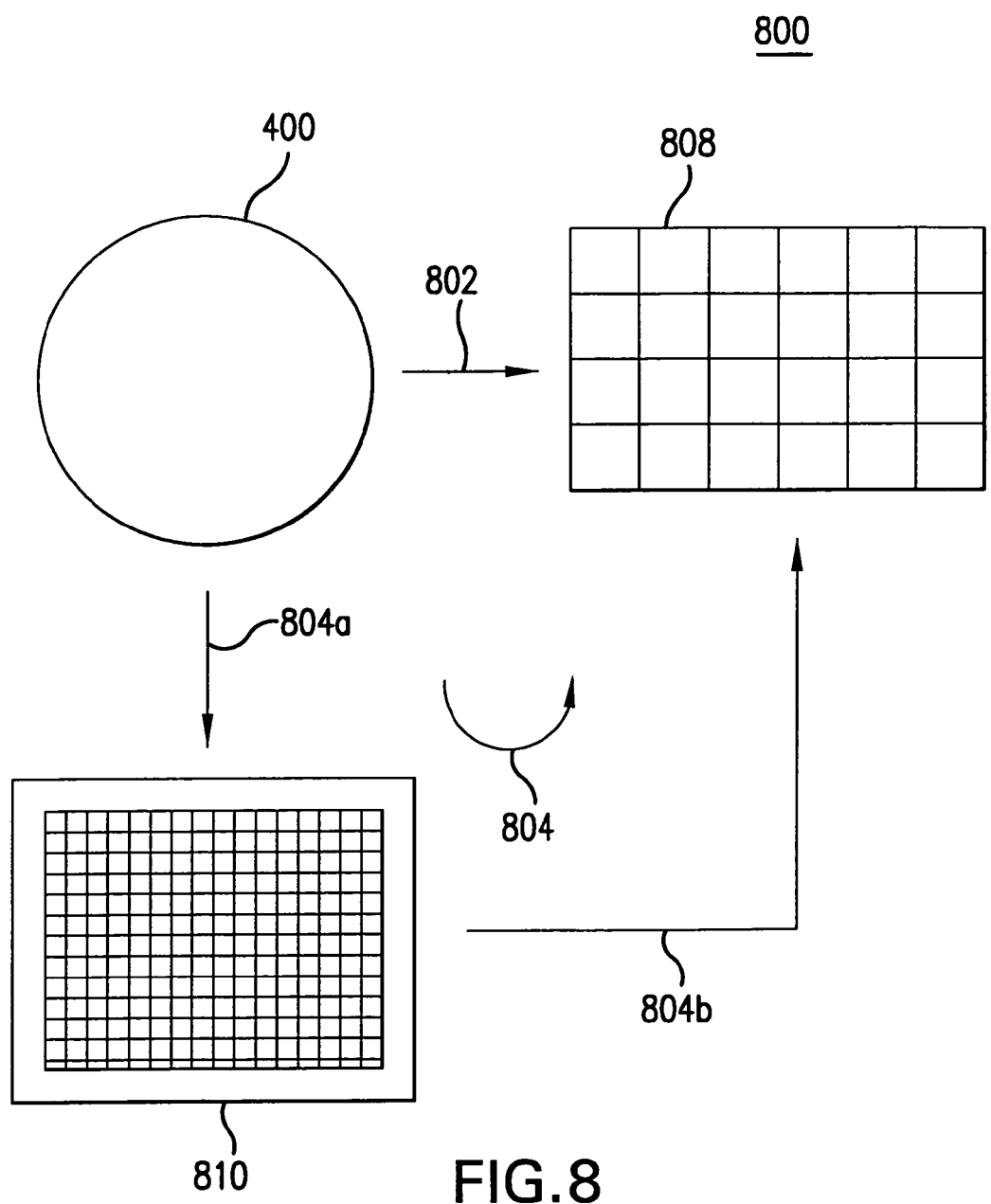
FIG. 8 shows a system diagram illustrating example options for transfer of dies from wafers to substrates, according to embodiments of the present invention.

FIG. 8 shows a high-level system diagram 800 that provides a representation of the different modes or paths of transfer of dies from wafers to substrates. FIG. 8 shows a wafer 400, a web 808, and a transfer surface 810. Two paths are shown in FIG. 8 for transferring dies, a first path 802, which is a direct path, and a second path 804, which is a path having intermediate steps. For example, as shown in FIG. 8, first path 802 leads directly from wafer 400 to web 808. In other words, dies can be transferred from wafer 400 to substrates of substrate 808 directly, without the dies having first to be transferred from wafer 400 to another surface or storage structure. However, according to path 804, at least two steps are required, path 804A and path 804B. For path 804A, dies are first transferred from wafer 400 to an intermediate transfer surface 810. The dies then are transferred from transfer surface 810 via path 804B to the substrates of web 808. Paths 802 and 804 each have their advantages. For example, path 802 can have fewer steps, but can have issues of die registration, and other difficulties. Path 804 typically has a larger number of steps than path 802, but transfer of dies from wafer 400 to a transfer surface 810 can make die transfer to the substrates of web 808 easier, as die registration may be easier.

Figure 9:
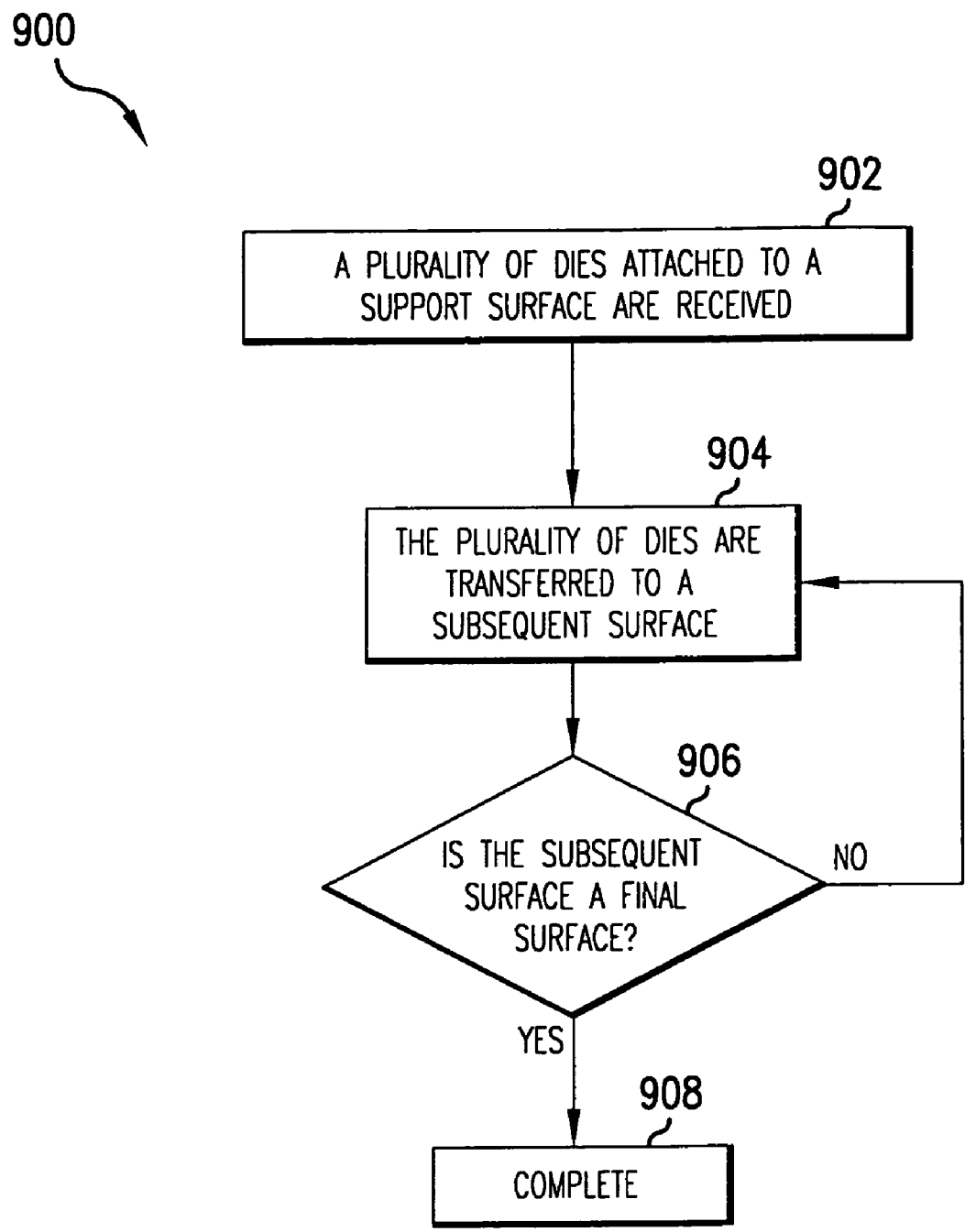
FIGS. 9 and 10 show flowcharts providing steps for transferring dies from a first surface to a second surface, according to embodiments of the present invention.
Figure 10:
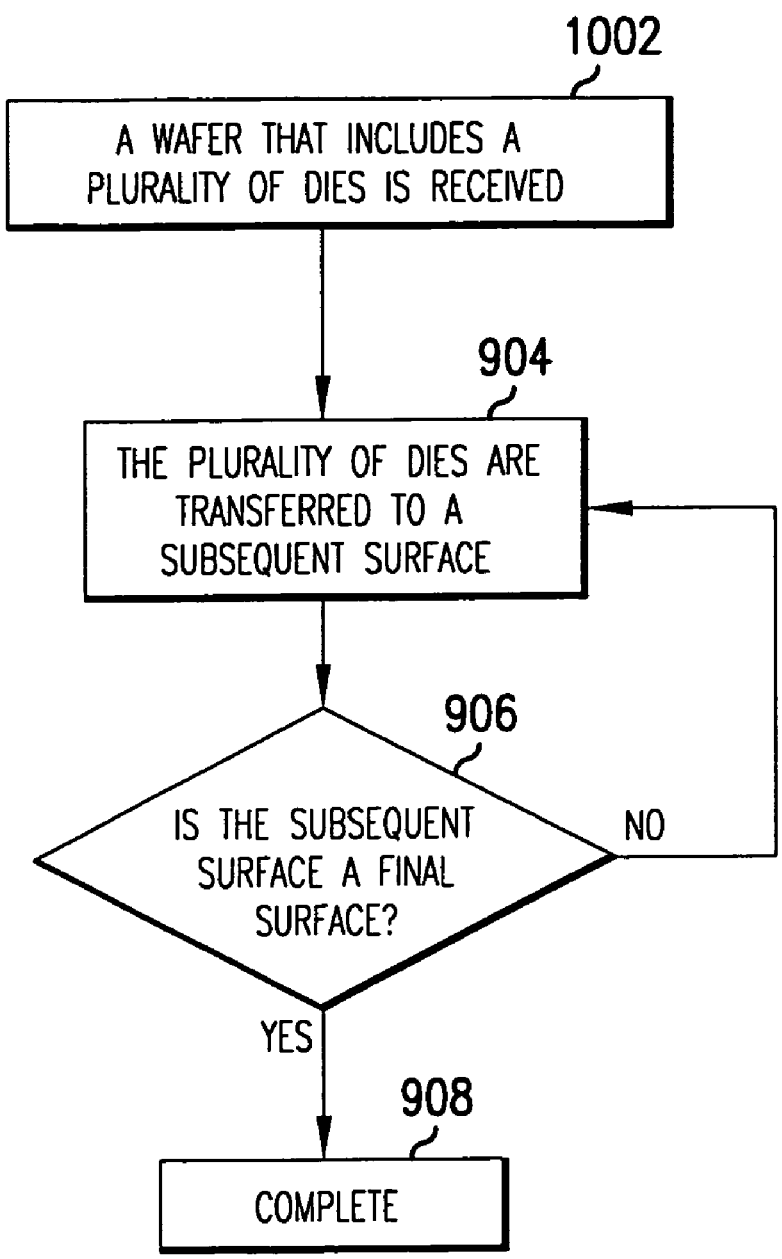

FIGS. 9 and 10 show flowcharts providing steps for transferring dies from a first surface to a second surface, according to embodiments of the present invention. Structural embodiments of the present invention will be apparent to persons skilled in the relevant art(s) based on the following discussion. These steps are described in detail below.

Flowchart 900 begins with step 902. In step 902, a plurality of dies attached to a support surface is received. For example, the dies are dies 104, which are shown attached to a support surface 404 in FIG. 4A. For example, the support surface can be a "green tape" or "blue tape" as would be known to persons skilled in the relevant art(s).

In step 904, the plurality of dies are transferred to a subsequent surface. For example, dies 104 may be transferred according to embodiments of the present invention. For example, the dies may be transferred by an adhesive tape, a punch tape, a multi-barrel transport mechanism and/or process, die frame, pin plate, such as are further described below and/or in the incorporated patent applications, and may be transferred by other mechanisms and processes, or by combinations of the mechanisms/processes described herein. In embodiments, the subsequent surface can be an intermediate surface or an actual final substrate. For example, the intermediate surface can be a transfer surface, including a "blue tape," as would be known to persons skilled in the relevant art(s). When the subsequent surface is a substrate, the subsequent surface may be a substrate structure that includes a plurality of tag substrates, or may be another substrate type.

In block 906, if the subsequent surface is a substrate to which the dies are going to be permanently attached, the process of flowchart 900 is complete. The process can then proceed to step 310 of flowchart 300, if desired. If the subsequent surface is not a final surface, then the process proceeds to step 904, where the plurality of dies are then transferred to another subsequent surface. Step 904 may be repeated as many times as is required by the particular application.

Flowchart 1000 of FIG. 10 is substantially similar to flowchart of 900. However, instead of including step 902, flowchart 1000 includes step 1002. In step 1002, a wafer that includes a plurality of dies is received. Thus, in flowchart 1000, a wafer 400 is operated on directly, without being applied to a support surface or structure. Embodiments for both of flowcharts 900 and 1000 are described herein.

Any of the intermediate/transfer surfaces and final substrate surfaces may or may not have cells formed therein for dies to reside therein. Various processes described below may be used to transfer multiple dies simultaneously between first and second surfaces, according to embodiments of the present invention. In any of the processes described herein, dies may be transferred in either pads-up or pads-down orientations from one surface to another.

The die transfer processes described herein include transfer using an adhesive surface, a parallel die punch process, die plates, including die receptacle structures, pin plates, die transfer heads, and die transfer head coverage patterns. Elements of the die transfer processes described herein may be combined in any way, as would be understood by persons skilled in the relevant art(s). These die transfer processes, and related example structures for performing these processes, are further described in the following subsections.

Example Wafer Expanding and Die Transfer Embodiments

As described above with respect to FIGS. 6 and 7A-7C, a singulated wafer attached to a support structure may be expanded, to increase a space between the separated dies of the wafer. This increase of space between the separated dies may be advantageously used to enhance ease of the transfer of the dies from the support structure to a target destination surface, such as an intermediate die transfer surface, or to one or more destination substrates. Example embodiments for expanding a wafer, and for transferring dies therefrom, are described below. These example embodiments are provided for illustrative purposes, and are not limiting. Additional embodiments for expanding wafers and transferring dies will be apparent to persons skilled in the relevant art(s) from the teachings herein. These additional embodiments are within the scope and spirit of the present invention.

Figure 11A:
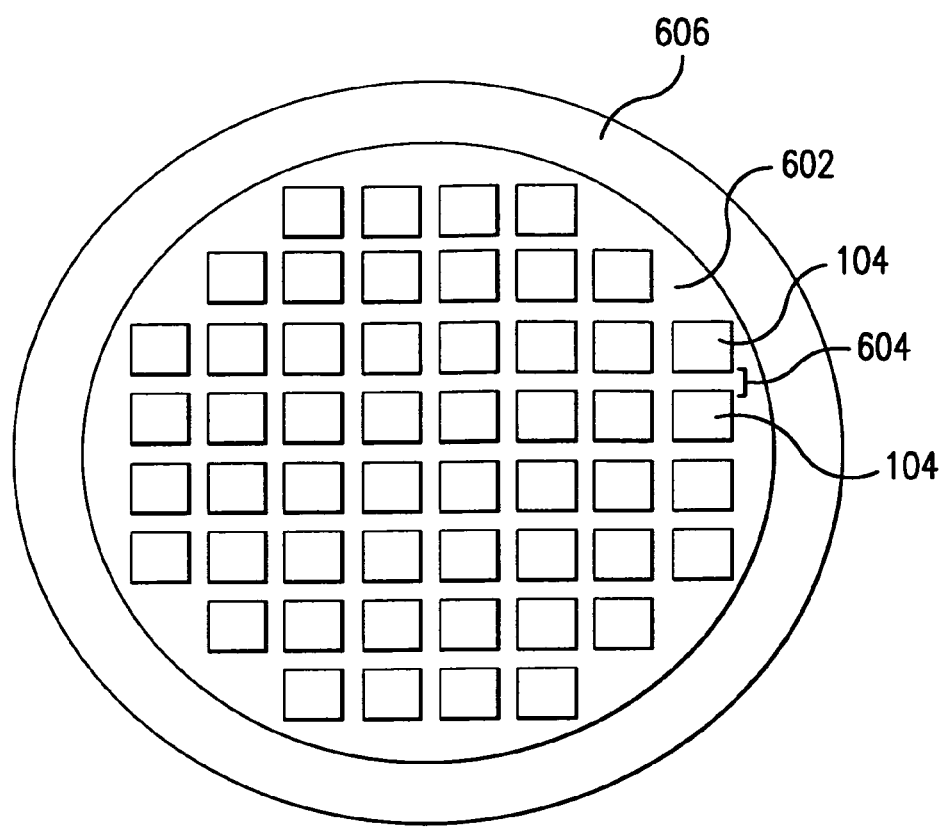
FIGS. 11A and 11B show views of a singulated wafer attached to support structure, which is held in a wafer frame, according to an embodiment of the present invention.
Figure 11B:
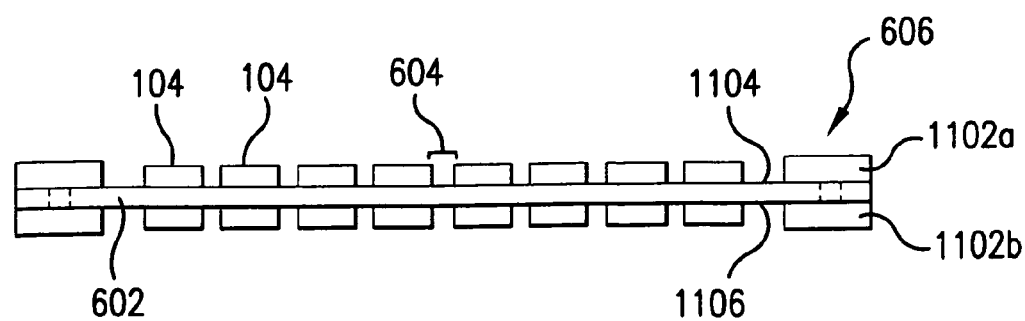

FIG. 11A shows a plan view of a singulated wafer attached to support structure 602, which is held in a wafer frame 606. As shown in FIG. 11A, a space or gap 604 is present between dies 104 on support structure 602. FIG. 11B shows a cross-sectional view of the singulated wafer attached to support structure 602 shown in FIG. 11A. As shown in the examples of FIGS. 11A and 11B, wafer frame 606 surrounds dies 104, and has a first portion 1102a attached to a first surface 1104 of support structure 602 and a second portion 1102b attached to an opposed second surface 1106 of support structure 602. As shown in FIG. 11B, first portion 1102a may be coupled to second portion 1102b by one or more structural links 1104. Structural links 1104 may be pins, bolts, screws, or any other suitable coupling device. Wafer frame 606 holds support structure 602 relatively taut so that dies 104 may be accessed from support structure 602.

An area of support structure 602 may be increased in various ways to increase space 604 between dies 104, according to step 706 described above with respect to FIG. 7A. For example, in an embodiment, wafer frame 606 may comprises a plurality of separate segments. The separate segments may be pulled apart from each other to increase an area of support structure 604.

Figure 12A:
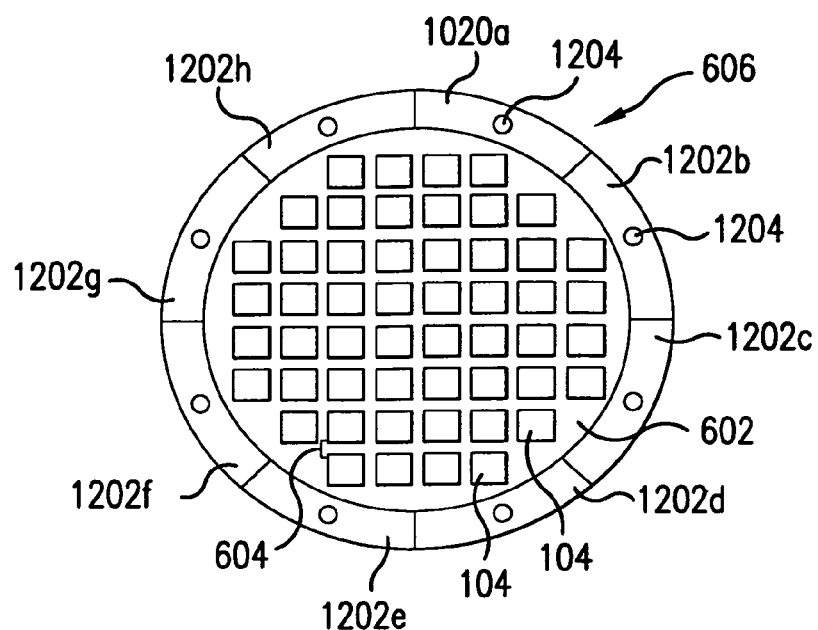
FIG. 12A shows a wafer frame that includes multiple wafer frame segments, holding a support structure attaching a plurality of dies, according to an example embodiment of the present invention.

FIG. 12A shows wafer frame 606 that includes eight wafer frame segments 1202*a-h*, according to an example embodiment of the present invention. In FIG. 12A, dies 104 are separated on support structure 604, prior to being expanded. Each of wafer frame segments 1202*a-h* includes one or more corresponding connection points 1204, to which a wafer expander mechanism may connect. For example, connection points 1204 may be holes, knobs, or any other connection mechanism type.

Figure 12B:
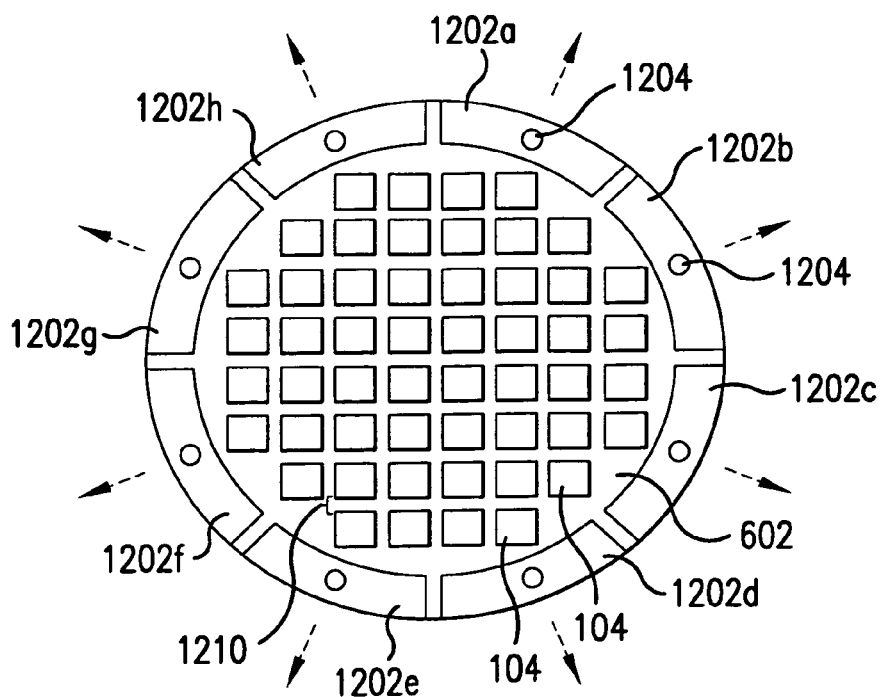
FIG. 12B shows the wafer frame of FIG. 12A being expanded, according to an example embodiment of the present invention.

FIG. 12B shows support structure 604 being expanded, by radially pulling apart wafer frame segments 1202*a-h*. In FIG. 12B, an expanded gap or space 1210 exists between dies 104 on support structure 604. Space 1210 in FIG. 12B is greater than space 604 shown in FIG. 12A due to the pulling apart of wafer frame segments 1202*a-h*.

In another example embodiment, an area of support structure 602 may be increased to increase a space between dies by first stretching support structure 602, and subsequently attaching wafer frame 606 to the enlarged support structure 602 to hold it in an expanded state.

Figure 13A:
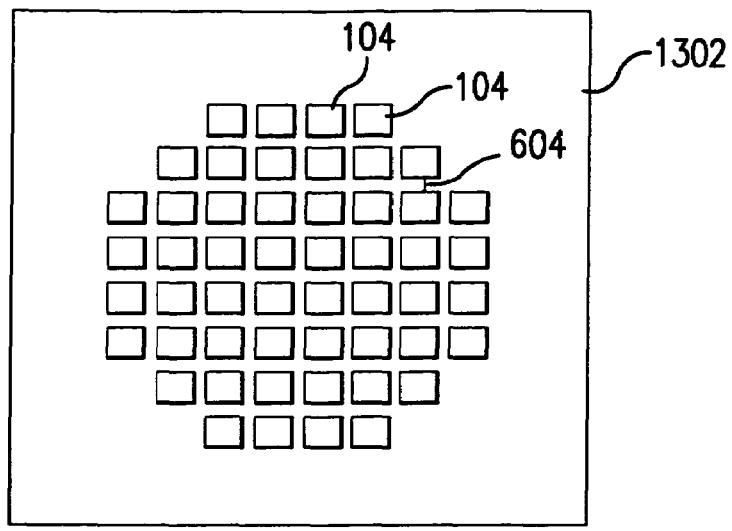
FIG. 13A shows dies of a singulated wafer attached to a support structure, in an unexpanded state.
Figure 13B:
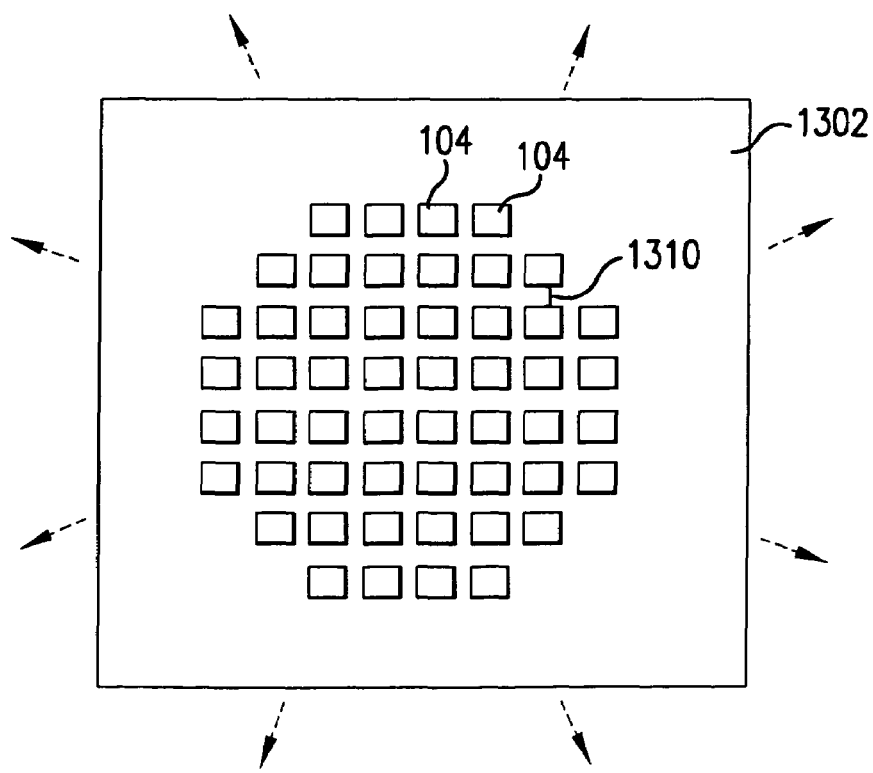
FIG. 13B shows the support structure of FIG. 13A being radially stretched/expanded, to increase an area of the support structure, according to an example embodiment of the present invention.
Figure 13C:
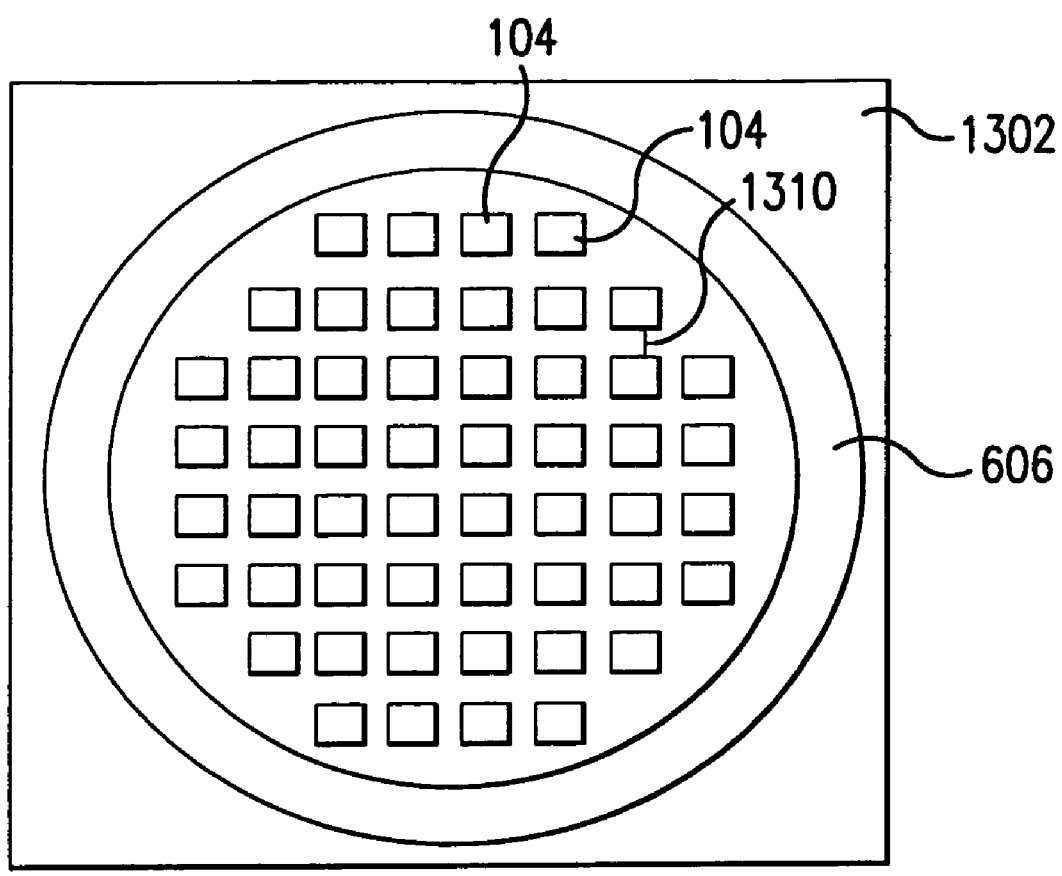
FIG. 13C shows a die frame attached to the expanded support structure of FIG. 13B, according to an example embodiment of the present invention.

For example, FIG. 13A shows dies 104 of a singulated wafer attached to a support structure 1302, in an unexpanded state. As shown in FIG. 13A, dies 104 are separated by space 604. FIG. 13B shows support structure 1302 being radially stretched/expanded, to increase an area of support structure 1302. In FIG. 13B, an expanded gap or space 1310 exists between dies 104 on support structure 1302. Space 1310 in FIG. 13B is greater than space 604 shown in FIG. 13A due to the stretching or expanding of support structure 1302. Support structure 1310 can be stretched in any conventional or otherwise known manner. FIG. 13C shows wafer frame 606 attached to the expanded support structure 1310 of FIG. 13B, to maintain support structure 1310 in the expanded state.

Figure 14:
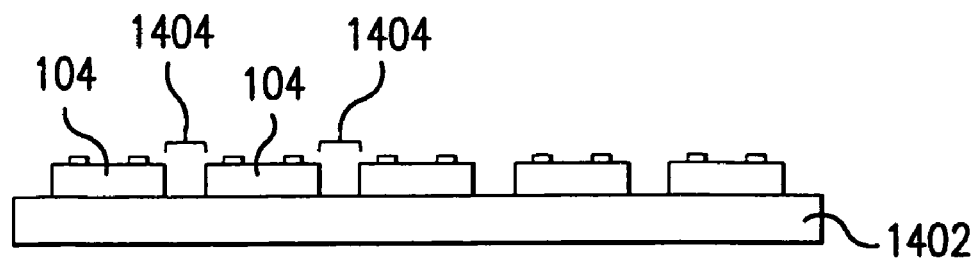
FIG. 14 shows a cross-sectional view of an expanded support structure that attaches dies of a singulated wafer, according to an example embodiment of the present invention.

After a support structure has been expanded, to increase a space between dies, such as described above with regards to the examples of FIGS. 12A, 12B, and 13A-13C, the expanded support structure/wafer may be further processed, to enhance/enable transfer of dies from the support structure to another surface. For example, FIG. 14 shows a cross-sectional view of an expanded support structure 1402 that attaches dies 104 of a singulated wafer, having expanded gaps or spaces 1404 between dies 104 (wafer frame 606 not shown). Examples for further processing of expanded support structure 1402 attaching dies 104 are described below.

Figure 15:
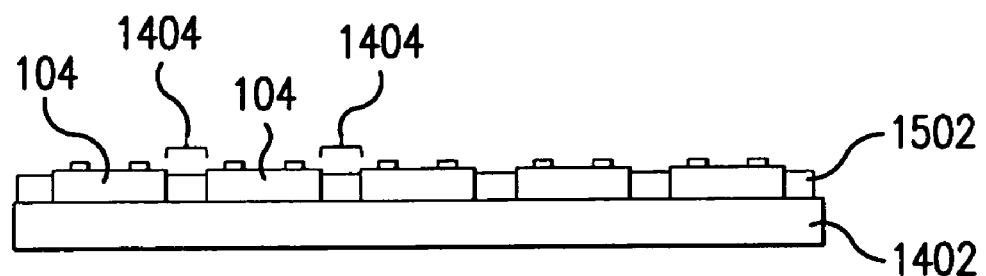
FIG. 15 shows a die frame formed around the dies attached to the expanded support structure of FIG. 14, according to an example embodiment of the present invention.

For example, as shown in FIG. 15, in an embodiment, a die frame 1502 may be formed around dies in the expanded spaces 1404. For example, die frame 1502 may be formed according to the flowchart shown in FIG. 7C, or by other mechanisms or processes. Die frame 1502 holding dies 104 may then be peeled/separated from support structure 1402. Dies 104 may be transferred from die frame 1502 to subsequent surfaces as needed.

Figure 16:
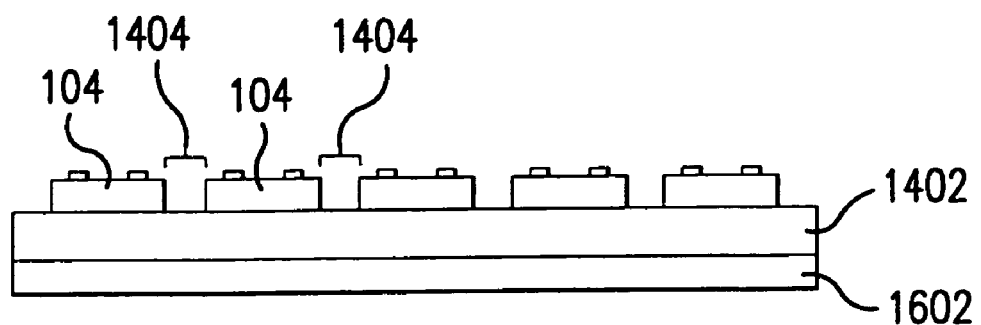
FIG. 16 shows a support layer formed on the expanded support structure of FIG. 14, according to an example embodiment of the present invention.

In another example embodiment, as shown in FIG. 16, a support layer 1602 can be formed on expanded support structure 1402 on a surface opposite of dies 104. Support layer 1602 can be applied as a liquid that solidifies (e.g., an epoxy), as a solid layer that attaches to support structure 1402, as an adhesive structure, or as any other support layer type. Support layer 1602 adheres to support structure 1402, and maintains support structure 1402 in an expanded state. Thus, in an embodiment, wafer frame 606 can be removed from support structure 1402, while support layer 1602 maintains support structure 1402 in an expanded state.

Figure 17:
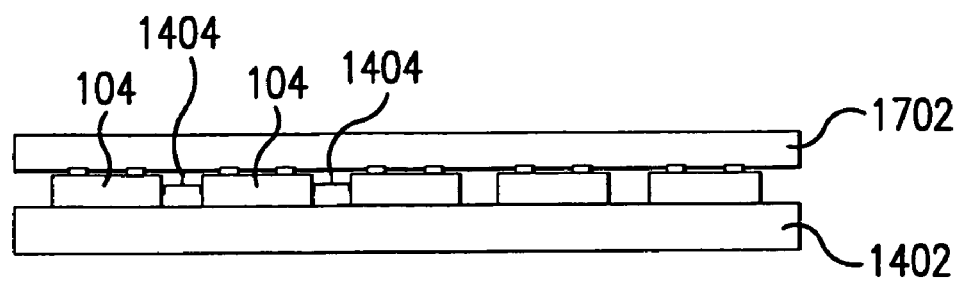
FIG. 17 shows a support layer formed on the dies attached to the expanded wafer of FIG. 14, according to an example embodiment of the present invention.

In another example embodiment, as shown in FIG. 17, a support layer 1702, generally similar to support layer 1602 of FIG. 16, can be formed on expanded dies 104. Support layer 1702 can be applied as a liquid that solidifies (e.g., an epoxy), as a solid layer that attaches to support structure 1402, as an adhesive structure, or as any other support layer type. In an embodiment, such as shown in FIG. 17, support layer 1702 (such as when applied as a liquid) does not enter spaces 1404 between dies 104. In this manner, support structure 1402 can subsequently be removed/peeled from dies 104 if desired, leaving support layer 1702 supporting dies 104 in the expanded state. In an alternative embodiment, support layer 1702 (such as when applied as a liquid) does enter spaces 1404.

Figure 18:
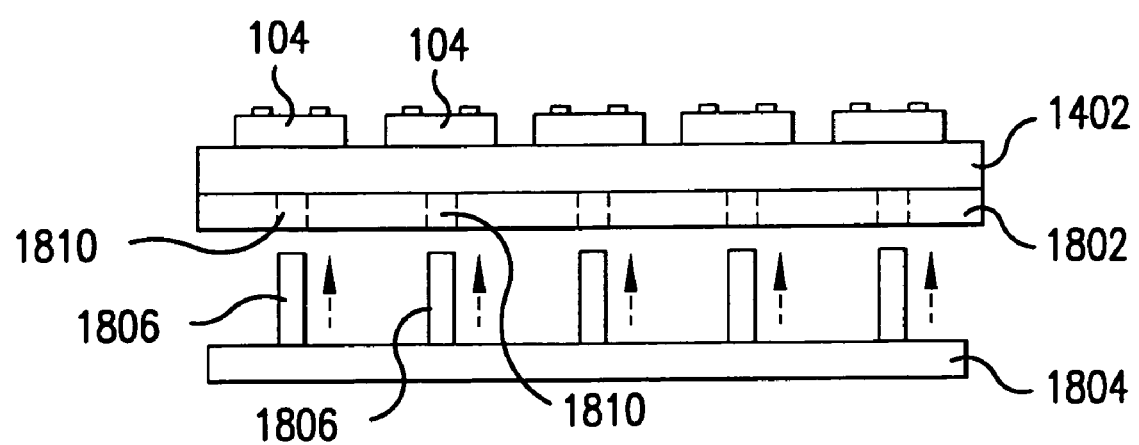
FIG. 18 shows the expanded support structure of FIG. 14 attached to a die plate, for transfer of dies, according to an example embodiment of the present invention.

In another example embodiment, the expanded support structure 1402 is applied to a die plate 1802, and dies 104 are transferred from expanded support structure 1402 to one or more subsequent surfaces using die plate 1802. For example, as shown in FIG. 18, a pin plate 1804 having one or more pins 1806 can be applied to die plate 1802. Pins 1806 pass through corresponding holes 1810 of die plate 1802 to push/punch dies from expanded support structure 1402 onto a subsequent surface (not shown in FIG. 18), such as an intermediate transfer surface, or one or more substrates. Because dies 104 are more greatly spread out on support surface 1402 (e.g., have greater die pitch) due to the expanding of support surface 1402, dies 104 can be more easily transferred in parallel to a corresponding plurality of substrates, of various sizes, depending on the spread of dies 104 on support surface 1402.

For further information on example pin plates, refer to co-pending U.S. application Ser. No. 10/866,159, titled "Method, System, And Apparatus For Transfer Of Dies Using A Pin Plate," having the same filing date as the present application, which is incorporated by reference in its entirety herein.

Figure 19:
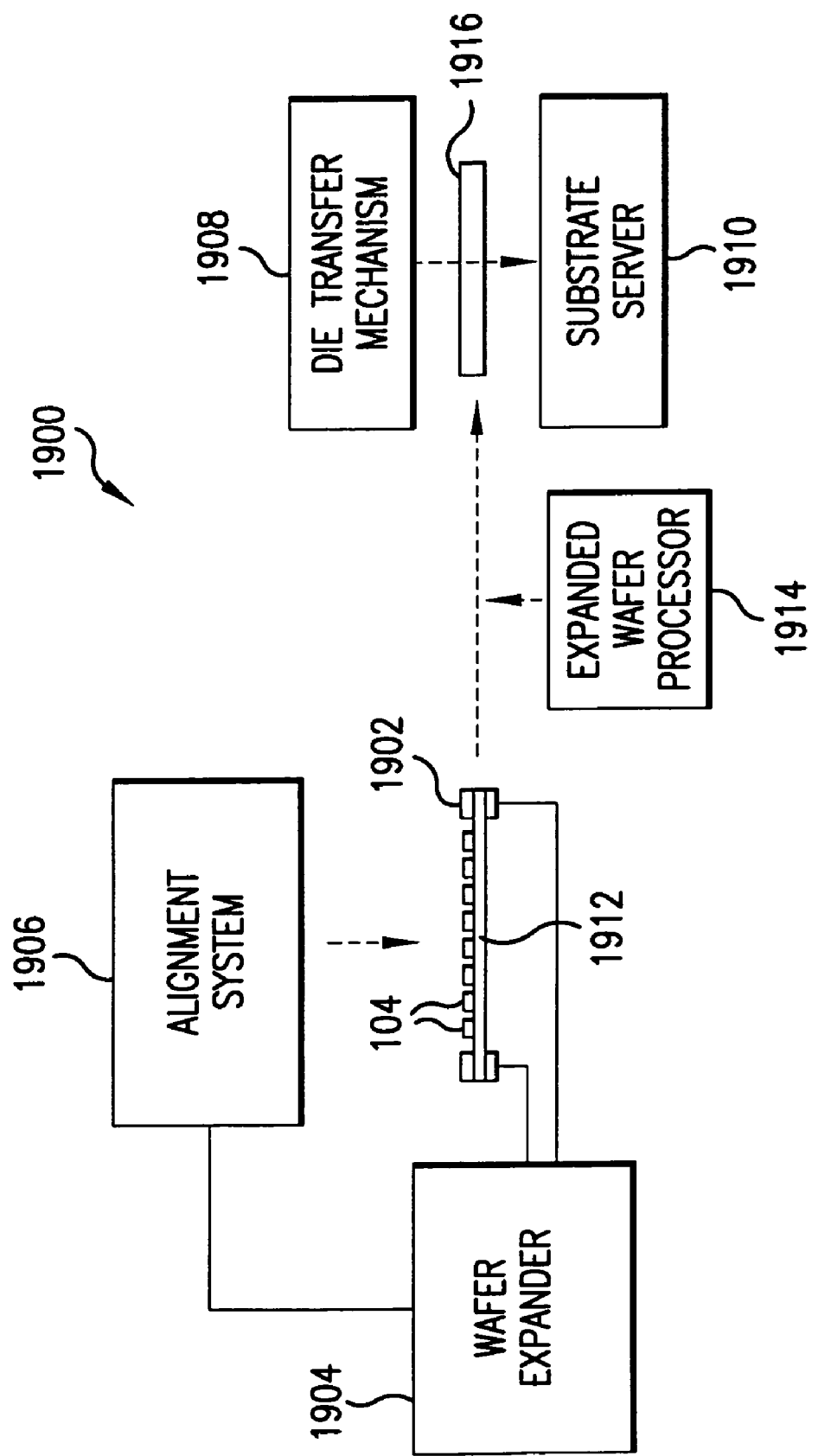
FIG. 19 shows an example system for expanding a wafer, and transferring dies from the expanded wafer, according to an embodiment of the present invention.

FIG. 19 shows an example system 1900 for expanding a wafer, and utilizing an expanded wafer, according to an embodiment of the present invention. Further system embodiments will be apparent to persons skilled in the relevant art(s) from the teachings herein.

As shown in FIG. 19, system 1900 includes a wafer frame 1902, a wafer expander 1904, an alignment system 1906, a die transfer mechanism 1908, a substrate server 1910, and an expanded wafer processor 1914. Wafer frame 1902 holds a support structure 1912 that attaches a plurality of dies 104 of a separated wafer.

Wafer expander 1904 increases an area of support structure 1912 to increase a spacing of dies 104 on support structure 1912. Thus, for example, wafer expander 1904 can perform step 706 shown in FIG. 7A. For example, in an embodiment, elements of wafer expander 1904 couple to wafer frame 1902 by connection points or other mechanisms. Wafer expander 1904 may expand support structure 1912 using mechanical (e.g., motors), electromechanical, pneumatic, magnetic, or any other mechanism. In an embodiment for a wafer frame having multiple segments, such as shown in FIGS. 12A and 12B, wafer expander 1904 may include and/or control multiple separate motors, etc., for moving apart the multiple segments to spread the support structure.

Alignment system 1906 monitors and detects the amount of spreading of support structure 1912, and/or the spreading of dies 104, to ensure that dies 104 are spread to a desired spacing/die pitch. In an embodiment, alignment system 1906 is coupled to wafer expander 1904 to feed back spacing measurements to wafer expander 1904. In this manner, dies 104 can be spread to a desired spacing/die pitch to be handled by a pin plate or other die transfer mechanism, to be transferred to a subsequent surface. For example, alignment system 1906 may be an optical alignment system, a mechanical alignment system, and/or any other type of alignment system.

As shown in FIG. 19, once support structure 1912 has been appropriately expanded, the combination of expanded support structure 1912, dies 104, and die frame 1902 (i.e., the expanded wafer) may be further processed by expanded wafer processor 1914 (when present). Expanded wafer processor 1914 may be used to create a die frame (e.g., as described above with respect to FIGS. 7C and 15), to add one or more layers (e.g., such as support layers 1602 and 1702 described above), to remove support structure 1912 if desired, to attach support structure 1912 to a die plate (e.g., such as die plate 1802), and/or for other processing of an expanded wafer.

After processing by wafer processor 1914, a processed expanded wafer 1916 can be further processed, such as by transferring dies from processes expanded wafer 1916 to intermediate surfaces or destination surfaces, such as one or more substrates. For example, as shown in FIG. 19, a substrate (or other target surface) server 1910 may be present to supply substrates. The substrates may be supplied singly, or in webs of multiple substrates. Die transfer mechanism 1908 is used to transfer dies 104 from processed expanded wafer 1916 to substrates of substrate server 1910, according to any die transfer process or mechanism. For example, die transfer mechanism 1908 may include a pin plate (e.g., such as pin plate 1804 shown in FIG. 18) to push/punch dies from processed expanded wafer 1916. For instance, die transfer mechanism 1908 may be used to perform step 708 described above with respect to FIG. 7B.

Conclusion

While various embodiments of the present invention have been described above, it should be understood that they have been presented by way of example, and not limitation. It will be apparent to persons skilled in the relevant arts that various changes in form and detail can be made therein without departing from the spirit and scope of the invention. Thus the present invention should not be limited by any of the above-described exemplary embodiments, but should be defined only in accordance with the following claims and their equivalents.

What is claimed is:

1. A method for enhancing die transfer capability, comprising:
    (A) receiving a plurality of dies of a separated wafer on a support structure;
    (B) increasing an area of the support structure to increase a space between adjacent dies of the plurality of dies;
    (C) inserting a solidifiable material into the increased space between adjacent dies;
    (D) causing the solidifiable material to harden into a solid grid that removably holds the plurality of dies;
    (E) removing the support structure from the solid grid that removably holds the plurality of dies; and
    (F) transferring at least one die of the plurality of dies from the solid grid while the solid grid remains substantially intact.

2. The method of claim 1, wherein step (F) comprises:
    (1) transferring at least one die of the plurality of dies from the solid grid to a surface.

3. The method of claim 1, wherein the surface is a surface of a substrate, wherein step (1) comprises:
    transferring at least one die of the plurality of dies from the solid grid to the substrate.

4. The method of claim 1, wherein step (F) comprises:
    transferring the plurality of dies from the solid grid to a plurality of substrates having a spacing that corresponds to the increased space between adjacent dies of the plurality of dies.

5. The method of claim 1, wherein step (F) comprises:
    transferring the plurality of dies from the solid grid to a structure having a plurality of receptacles that are spaced according to the increased space between adjacent dies of the plurality of dies.

6. The method of claim 1, wherein step (F) comprises:
    (1) transferring the plurality of dies from the solid grid to a die plate having a plurality of die attach positions that are spaced according to the increased space between adjacent dies of the plurality of dies.

7. The method of claim 6, wherein step (1) comprises:
    punching through holes in the die plate to transfer dies from the die plate to a subsequent surface.

8. The method of claim 1, wherein step (B) comprises:
    stretching the support structure along at least one axis in a plane of the support structure.

9. The method of claim 1, further comprising:
    (F) attaching a die plate to the solid grid.

10. The method of claim 1, wherein step (A) comprises:
    attaching a wafer to a support structure; and
    separating the wafer on the support structure into the plurality of dies.

11. The method of claim 1, wherein step (B) comprises:
    stretching the support structure along a first axis.

12. The method of claim 1, wherein step (B) comprises:
    stretching the support structure along a first axis and along a second axis that is orthogonal to the first axis.

13. The method of claim 1, wherein step (C) comprises:
    inserting a liquid solidifiable material into the increased space between adjacent dies.

14. The method of claim 1, wherein step (C) comprises:
    inserting an epoxy into the increased space between adjacent dies.

* * * * *